(12) United States Patent
Haddadin et al.

(10) Patent No.: US 7,747,666 B2
(45) Date of Patent: Jun. 29, 2010

(54) PARALLEL FILTER REALIZATION FOR WIDEBAND PROGRAMMABLE DIGITAL RADIOS

(75) Inventors: Osama Sami Haddadin, Salt Lake City, UT (US); Brad Terry Hansen, Salt Lake City, UT (US); L. Andrew Gibson, Jr., Riverton, UT (US); Roland Richard Henrie, Provo, UT (US)

(73) Assignee: L-3 Communications Corporation, New York, NY (US)

( * ) Notice: Subject to any disclaimer, the term of this patent is extended or adjusted under 35 U.S.C. 154(b) by 1007 days.

(21) Appl. No.: 10/914,554

(22) Filed: Aug. 9, 2004

(65) Prior Publication Data

US 2006/0031274 A1 Feb. 9, 2006

(51) Int. Cl.
*G06F 17/17* (2006.01)
(52) U.S. Cl. ...................................... 708/313
(58) Field of Classification Search .............. 708/716, 708/719, 313, 316, 319
See application file for complete search history.

(56) References Cited

U.S. PATENT DOCUMENTS

| | | | | | |
|---|---|---|---|---|---|
| 4,777,612 | A | * | 10/1988 | Tomimitsu | 708/316 |
| 4,821,223 | A | * | 4/1989 | David | 708/308 |
| 5,029,121 | A | * | 7/1991 | Kawata et al. | 708/319 |
| 5,831,879 | A | * | 11/1998 | Yom et al. | 708/301 |
| 6,023,718 | A | * | 2/2000 | Dischert et al. | 708/307 |

* cited by examiner

*Primary Examiner*—Chuong D Ngo
(74) *Attorney, Agent, or Firm*—Perman & Green, LLP

(57) ABSTRACT

A block polyphase filter is constructed of a set of filter blocks having different filter functions, and being arranged for parallel processing of portions of an input sequence of signals. Signals of the input sequence are divided among the blocks by a demultiplexer for processing at a clock frequency lower than a clock frequency of the input signal sequence. The filter blocks are arranged in groups, wherein output signals of the blocks in any one group are summed to produce an output signal of the filtered group. Output signals of all of the filter groups are multiplexed to provide an output signal sequence wherein the repetition frequency of the signals may be higher, lower, or equal to the repetition frequency of the input signal sequence depending upon the ratio of the number of filter groups to the number of filter blocks in the set of filter blocks.

25 Claims, 15 Drawing Sheets

$$\begin{bmatrix} Y_0(z) \\ Y_1(z) \\ \vdots \\ Y_{M-2}(z) \\ Y_{M-1}(z) \end{bmatrix} = \begin{bmatrix} G_0(z) & G_1(z) & \cdots & G_{M-2}(z) & G_{M-1}(z) \\ z^{-1}G_{M-1}(z) & G_0(z) & \cdots & G_{M-3}(z) & G_{M-2}(z) \\ \vdots & \vdots & \ddots & \vdots & \vdots \\ z^{-1}G_2(z) & z^{-1}G_1(z) & \cdots & G_0(z) & G_1(z) \\ z^{-1}G_1(z) & z^{-1}G_2(z) & \cdots & z^{-1}G_{M-1}(z) & G_0(z) \end{bmatrix} \begin{bmatrix} X_0(z) \\ X_1(z) \\ \vdots \\ X_{M-2}(z) \\ X_{M-1}(z) \end{bmatrix}$$

FIG. 13

$$\begin{bmatrix} Y_0(z) \\ Y_1(z) \\ Y_2(z) \\ Y_3(z) \\ Y_4(z) \\ Y_5(z) \end{bmatrix} = \begin{bmatrix} G_0(z) & G_1(z) & G_2(z) & G_3(z) & G_4(z) & G_5(z) \\ z^{-1}G_5(z) & G_0(z) & G_1(z) & G_2(z) & G_3(z) & G_4(z) \\ z^{-1}G_4(z) & z^{-1}G_5(z) & G_0(z) & G_1(z) & G_2(z) & G_3(z) \\ z^{-1}G_3(z) & z^{-1}G_4(z) & z^{-1}G_5(z) & G_0(z) & G_1(z) & G_2(z) \\ z^{-1}G_2(z) & z^{-1}G_3(z) & z^{-1}G_4(z) & z^{-1}G_5(z) & G_0(z) & G_1(z) \\ z^{-1}G_1(z) & z^{-1}G_2(z) & z^{-1}G_3(z) & z^{-1}G_4(z) & z^{-1}G_5(z) & G_0(z) \end{bmatrix} \begin{bmatrix} X_0(z) \\ X_1(z) \\ X_2(z) \\ X_3(z) \\ X_4(z) \\ X_5(z) \end{bmatrix}$$

FIG. 14

$$\begin{bmatrix} Y_0(z) \\ Y_1(z) \\ Y_2(z) \\ Y_3(z) \\ Y_4(z) \\ Y_5(z) \end{bmatrix} = \begin{bmatrix} G_0(z) & G_3(z) \\ z^{-1}G_5(z) & G_2(z) \\ z^{-1}G_4(z) & G_1(z) \\ z^{-1}G_3(z) & G_0(z) \\ z^{-1}G_2(z) & z^{-1}G_5(z) \\ z^{-1}G_1(z) & z^{-1}G_4(z) \end{bmatrix} \begin{bmatrix} X_0(z) \\ X_1(z) \end{bmatrix}$$

$$\begin{bmatrix} Y_0(z) \\ Y_2(z) \\ Y_4(z) \end{bmatrix} = \begin{bmatrix} G_0(z) & G_1(z) & G_2(z) & G_3(z) & G_4(z) & G_5(z) \\ z^{-1}G_4(z) & z^{-1}G_5(z) & G_0(z) & G_1(z) & G_2(z) & G_3(z) \\ z^{-1}G_2(z) & z^{-1}G_3(z) & z^{-1}G_4(z) & z^{-1}G_5(z) & G_0(z) & G_1(z) \end{bmatrix} \begin{bmatrix} X_0(z) \\ X_1(z) \\ X_2(z) \\ X_3(z) \\ X_4(z) \\ X_5(z) \end{bmatrix}$$

FIG. 15

$$\begin{bmatrix} Y_0(z) \\ Y_3(z) \end{bmatrix} = \begin{bmatrix} G_0(z) & G_1(z) & G_2(z) & G_3(z) & G_4(z) & G_5(z) \\ z^{-1}G_3(z) & z^{-1}G_4(z) & z^{-1}G_5(z) & G_0(z) & G_1(z) & G_2(z) \end{bmatrix} \begin{bmatrix} X_0(z) \\ X_1(z) \\ X_2(z) \\ X_3(z) \\ X_4(z) \\ X_5(z) \end{bmatrix}$$

FIG. 16

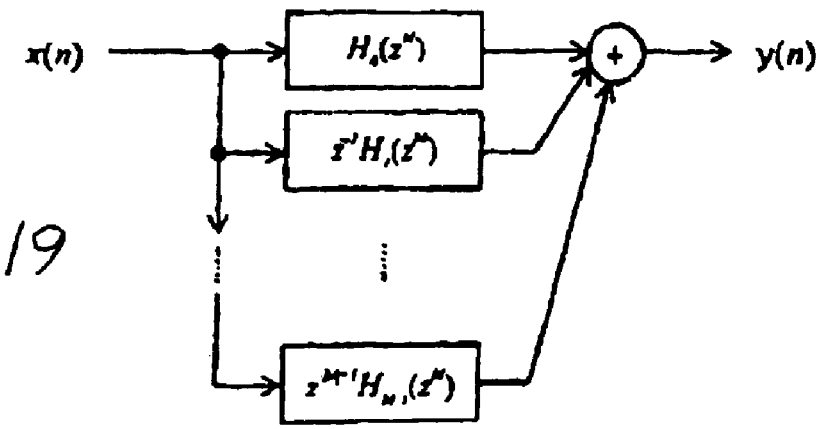
FIG. 19
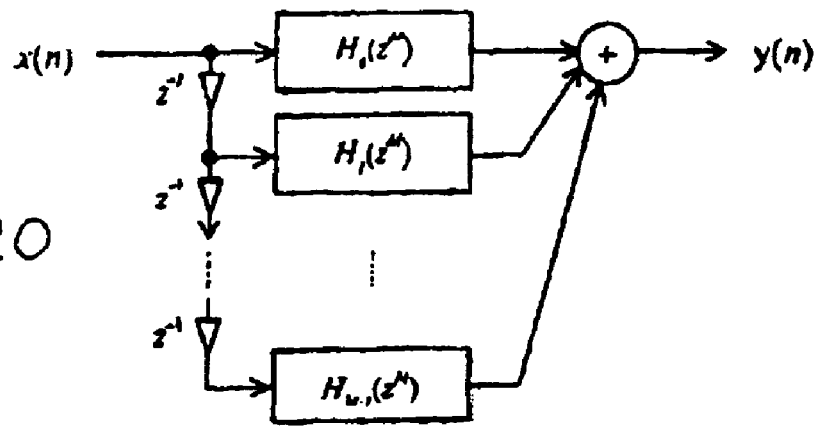
FIG. 20
FIG. 21

PARALLEL FILTER REALIZATION FOR WIDEBAND PROGRAMMABLE DIGITAL RADIOS

BACKGROUND OF THE INVENTION

1. Field of the Invention

This invention relates to realization of a filter for high speed signal processing in a communication system and, more particularly, to a parallel filter realization suitable for implementation in a field programmable gate array for software defined radios.

2. Brief Description of Related Developments

Communication systems are widely used in many situations including communication between persons, as in cellular telephony, and between various forms of equipment, such as between a satellite and a ground station. Various data formats and protocols have evolved to facilitate communication in differing situations. Communication may involve multiple access technologies such as CDMA (code division multiple access), TDMA (time division multiple access), FDMA (frequency division multiple access), modulation technologies such as PSK (phase shift keying), QAM (quadrature amplitude modulation), and FEC (forward error correction) such as Reed Solomon coding, convolutional encoding, and turbo coding, by way of example.

In high-speed communication systems, digital circuitry, particularly with digital programmable devices, is employed advantageously for processing the signals in high-speed communication systems. Digital circuitry (application specific integrated circuits (ASICs)) has been capable of achieving the required speed. Currently, the industry is a pursuing the use of programmable digital devices, which have not been able to achieve the desired speeds with currently available technology. Accordingly, there is concern that the digital circuitry should be able to function with sufficient speed to handle the high data rates associated with high-speed communication systems.

Industry today, for both commercial and military applications, is requiring modem hardware that is reconfigurable (programmable) by use of software. By way of example, it would be desirable that a telephone operating in the United States would have the capability to operate in Europe upon a reconfiguration of the software. The technology is known in the industry as software-defined radios, and requires that the hardware be programmable. Digital programmable signal-processing devices such as field programmable gate arrays (FPGAs) and digital signal processors (DSPs) are employed in the programmable wireless communications technology. These devices provide great flexibility and programmability, but their use, in the prior art, is at the expense of reduced processing speed, as compared to an ASIC by way of example.

To attain increased hardware flexibility, it is necessary to increase the rate of signal processing. By way of example, an increased rate of signal processing would allow for the transmission and the reception of multiple frequency channels, as in a frequency-division multiplex system, and would allow for digital frequency hopping in frequency-hopping spread spectrum systems, thereby eliminating the need for expensive and bulky synthesizers. A higher signal-processing rates allow for increased signal-transmission rates. It is noted that presently available A/D (analog-to-digital) and D/A (digital-to-analog) converters can operate at rates higher than 1000 million samples per second. In contrast, presently available digital signal processing is accomplished at a much slower rate in a digital signal-processing device such as the FPGA.

The most common digital signal processing operation is FIR (finite impulse response) filtering, which appears in modulators and demodulators in the form of various processing functions such as decimation, interpolation, pulse shaping, matched filtering, and equalization, by way of example. Known realizations (implementations) of FIR filters result in filters operable only at reduced signal-processing speed when constructed in FPGAs and DSPs due to the speed limitations of these devices.

Generally, in a communication system, incoming signals are received by a demodulation section of a modem, while outgoing signals are transmitted by a modulation section of the modem. By way of example in the construction of a demodulation section of a modem employing digital signal processing, an analog-to-digital converter is employed to convert the incoming analog signal to a digitally formatted signal prior to the implementation of the digital signal processing. The digital signal processing involves various forms of filtering, by way of example, and is accomplished generally by use of computational type circuitry such as FPGAs and DSPs. It is well known that circuitry employed for conversion from analog signal format to digital signal format is able to operate at a sample rate which is significantly faster than the rate for computational circuitry such as the FPGAs and the DSPs. Therefore, at the present time, the limitation on the digital processing speed of a communication channel is the nature of the construction of a digital filter that has been implemented by an FPGA or a DSP. While an application-specific integrated circuit (ASIC) may be employed to accomplish a filter function at a higher sample rate than an FPGA or a DSP, the ASIC is designed for a specific signal format or modulation, while the FPGA or the DSP have the advantage of being programmable to be adapted readily for a variety of signal formats and modulations. Thus, the digital signal processing circuitry presently available in FPGAs and DSPs introduce a disadvantageous limitation on the maximum sample rate for digital signal processing, such as the filtering of a signal, in a modulation or a demodulation section of a modem.

SUMMARY OF THE INVENTION

The aforementioned disadvantage is overcome and other benefits are provided by a construction of filter performing signal processing and a method of performing the signal processing on a succession of samples of an input signal. The filter is a digital filter processing digitized signals. If an analog signal were to be processed, then it would be sampled and digitized first by using an analog-to-digital converter, whereupon it can be processed by the digital filter of the invention. Accordingly, in the ensuing description, a preferred embodiment of the invention is described with reference to a digital signal processing of a succession of digitized input signal samples. Such processing can be described readily in terms of the mathematics of a Z transformation of the input signal samples. The implementation of the filter is accomplished in the time domain.

The present invention is particularly useful with FPGAs and DSPs, and may also the employed in ASICs for extending the processing speed of the ASICs still further. However, ASICs are not very desirable for use in software-defined radios. The present invention can be implemented also in other programmable devices such as multi-node or parallel or vector processors that contain multiple processing units, such as multipliers and accumulators, by way of example.

The filter of the invention is constructed in the manner of a block polyphase filter comprising plural groups of filters operated concurrently, wherein the filter groups are arranged in a parallel array between a set of input signals and a set of output signals. Each of the filter groups is composed of a set of filter blocks, each of the filter blocks being a polyphase component of the block polyphase filter. The filter blocks are operated concurrently wherein the filter blocks are arranged in a parallel array between the set of input signals and the set of output signals. The filter blocks in all of the filter groups operate at a common clock frequency.

To enable the filter to accommodate a high sampling rate, wherein multiple ones of the input signal arrive in succession within a single period of the clock, the succession of input signals is de-multiplexed so that, within each filter group, one input signal is applied to each filter block within one clock period. By way of example, if six input signals, in a sequence of the input signals, appear within one period of the clock, the block polyphase filter is constructed of six filter blocks within each filter group. Thus, by de-multiplexing the input signals, the rate of application of the signals to respective ones of the filter blocks is reduced to one-sixth of the original rate, and is equal to the clock rate for the processing of signals within a filter block.

The block polyphase filter may have a form of construction wherein there are more filter groups than the number of filter blocks within a filter group, this providing for a succession of output signals at a rate which is greater than the input-signal rate. An example of such construction will be shown in the ensuing description. Alternatively, the block polyphase filter may have a form of construction wherein the number of a the filter groups is equal to the number of filter blocks within a filter group, this providing for a succession of output signals at a rate which is equal to the input-signal rate. An example of such construction also will be shown in the ensuing description. As a further alternative, the block polyphase filter may have a form of construction wherein the number of filter groups is less than the number of filter blocks within a filter group, this providing for a succession of output signals at a rate which is lower than the input-signal rate. An embodiment of this construction will also be shown in the ensuing description. In the situation of the filter providing for an increased output rate of signals, the filter is providing a function of interpolation, and in the situation of the filter providing for a decreased output rate of signals, the filter is providing a function of decimation.

The characteristics of the individual filter blocks and the filter groups are obtained by a mathematical derivation employing a summation of mathematical terms including the impulse response of the filter, as will be described in detail hereinafter, and leading to a matrix formulation wherein the terms of the matrix are the z transform representations of the filter functions provided by the filter blocks in a filter group. A feature of the matrix is that the arrangement of the terms in successive rows of the matrix is obtained as a permutation of the terms of the first row. Furthermore, the terms present below the diagonal of the matrix also include a delay factor equal to the period of the clock. The multiplication of each row of the matrix by the column of the input signals (in the z-transform notation) involves a summation of products to give an output signal from one filter group. (It is noted that multiplication in the z-domain is equivalent to a filtering operation or convolution in the time domain.) The resulting output signals of the respective filter groups may be multiplexed, or them and may be processed further in parallel in the examples of a modulator and of a demodulator, described hereinafter, to provide a succession of the output signals.

While the block polyphase filter has numerous signal-processing applications in situations requiring very high speed filtering, including radar, image processing and array signal processing, as well as in communication systems. By way of example, the block polyphase filter is particularly useful in a modem, both in the modulation and the demodulation sections of the modem, to facilitate the processing of signals which would normally require circuitry especially adapted for high-frequency operation. This would normally entail the use of an ASIC configured for processing a specific form of signal having a designated modulation and coding. It is advantageous further to construct the modem with circuitry that is configurable by programming (use of software) for handling various signal formats, this being attainable by use of DSPs and FPGAs operable under any one of previously stored programs for the various signal formats. Since the DSPs and the FPGAs operate at lower clock rates than does an ASIC, the incorporation of the present block polyphase filter within a DSP or an FPGA enables the DSP or the FPGA to process an input train of signals of much higher sample rate than has been possible previously. This is particularly useful in FPGAs due to the availability of a large number of processing elements that can be used in parallel.

By way of example in the advantages of the present invention, one may consider a system in which an FPGA of the prior art running at a clock frequency of 100 MHz (megahertz) is able to filter a signal at a rate of 100 Msps (million samples per second) by processing one input sample and generating one output sample at each clock period. By reprogramming the FPGA, in accordance with the present invention, to have the 6-input, 6-output configuration, as will be described hereinafter in an embodiment of the invention, the same FPGA running at the clock rate of 100 MHz can now filter the signal at a rate of 600 MSPS by processing six input samples and generating six output samples during each clock period.

In view of the specific utility of the present block polyphase filter for enabling a modem to operate with a much higher signal input rate, while retaining the capacity for programmability to handle various signal formats, the description of the present block polyphase filter includes the operation of such a modem and a showing of how the filter cooperates with other components of the modem in obtaining the foregoing benefits.

BRIEF DESCRIPTION OF THE DRAWING

The aforementioned aspects and other features of the invention are explained in the following description, taken in connection with the accompanying drawing figures wherein:

FIG. 13 shows a matrix equation for six inputs and six outputs to explain operation of the filter of FIG. 9;

FIG. 14 shows a matrix equation for two inputs and six outputs to explain operation of the filter of FIG. 8;

FIG. 15 shows a matrix equation for six inputs and three outputs to explain operation of the filter of FIG. 10;

FIG. 16 shows a matrix equation for six inputs and two outputs to explain operation of the filter of FIG. 11;

FIGS. 17-21 present diagram useful in understanding a mathematical derivation of the filtering process of the invention.

Identically labeled elements appearing in different ones of the figures refer to the same element but may not be referenced in the description for all figures.

DETAILED DESCRIPTION OF THE INVENTION

The ensuing description begins with the description of a communication system, generally, and then shows how the parts of the communication system may be implemented by modulation and demodulation sections of a modem. The locations of various components of the modem, which can be fabricated with the block polyphase filter of the present invention, are disclosed. This is then followed by a detailed description of the construction and operation of the block polyphase filter.

Figure 1:
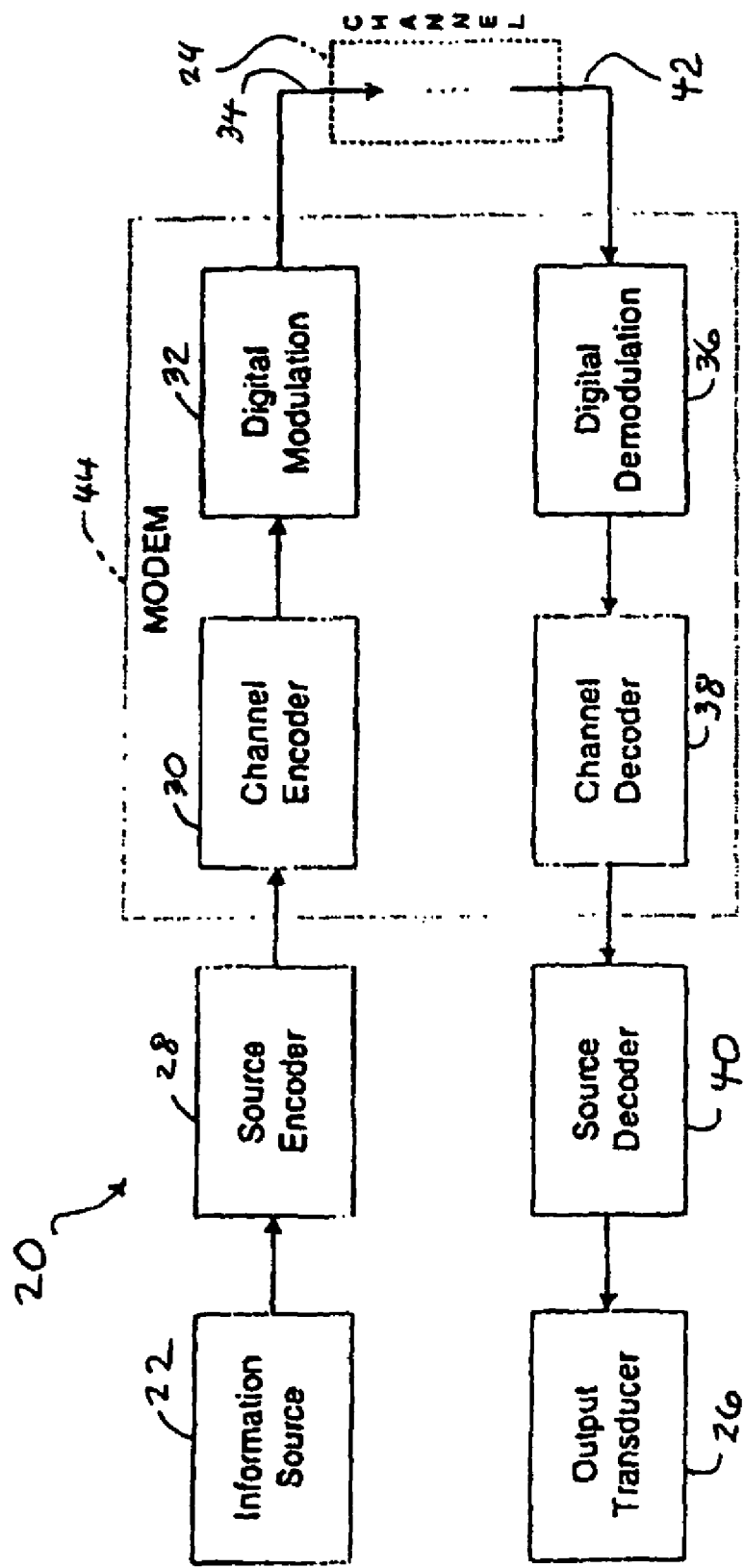
FIG. 1 is a block diagram of a communication system having components which can be constructed in accordance with the block polyphase filter of the invention.

FIG. 1 shows a basic communication system 20, wherein information, provided by a source 22, is communicated by a communication channel 24 to be outputted by a transducer 26. The information source 22, along with a source encoder 28, a channel encoder 30 and a digital modulator 32 are located on a transmit side 34 of the communication channel 24. The output transducer 26, along with a digital demodulator 36, a channel decoder 38 and a source decoder 40 are located on a receive side 42 of the communication channel 24.

The information provided by the source 22 is encoded first by the source encoder 28 and then by the channel encoder 30, the encoding being followed by digital modulation in the modulator 32 preparatory to transmission via the communication channel 24. Signals received from the communication channel 24 undergo digital demodulation at the demodulator 36, the demodulation being followed by decoding in the channel decoder 38 and by further decoding in the source decoder 40, whereupon the decoded signals are applied to the output transducer 26. The channel encoder 30 and the digital modulator 32 are employed with other equipment, such as carrier up-conversion and filtering (to be described hereinafter, but not shown in FIG. 1), employed in the transmission of signals. The digital demodulator 36 and the channel decoder 38 are employed with other equipment, such as carrier down-conversion and filtering (to be described hereinafter, but not shown in FIG. 1), employed in the reception of signals.

The description of the communication system 20 presents a one-way communication of data from the information source 22 to the output transducer 26. For two-way communication via outgoing and incoming communication channels, a first modem and a second modem, each having both modulation and demodulation sections as provided by a modem 44, would be employed. The modem 44 is indicated in FIG. 1 by means of a dashed line enclosing components of the modem 44, these components including the channel encoder 30 and the digital modulator 32 for the transmission of signals, and the digital demodulator 36 and the channel decoder 38 for the reception of signals. To implement the two-way communication, the modulation section of the first modem would be connected to the transmit side of the outgoing communication channel for transmission of an outgoing signal, and the demodulation section of the second modem would be connected to the receive side of the outgoing communication channel for reception of the outgoing signal. The demodulation section of the first modem would receive a signal on the receive side of an incoming communication channel, which signal is transmitted by the modulation section of the second modem into the transmit side of the incoming communication channel. This description of the modem 44 is a simplified description, and a more detailed description of such a modem will be provided hereinafter with reference to FIG. 2. Generally speaking, the modem 44 provides the functions of the channel encoder/decoder and of the digital modulation/demodulation.

The present invention may be employed for construction of components of a modem, such as the modem 44, as well as for construction of components of a communication system, such as the system 20. In the practice of the invention, the utilization of programmable circuitry, such as an FPGA or a DSP, is useful in situations wherein a communications device is required to switch rapidly between multiple modes of communication, and this applies equally to both the construction of a modem as well as to the construction of a communication system. By way of example, the invention is particularly useful in time-division multiplexing or burst-like communication in which each burst or time slot requires specific characteristics of a modem or communication system, which characteristics differ from a previous time slot or from a subsequent time slot. The specific characteristics are readily attained by the programmable circuitry employed with the invention.

The information source 22, by way of example, may be a computer generating digital data (images, video and speech), a video camera converting optical signals to analog electrical signals, or a microphone converting sonic signals to analog electrical signals. The source encoder 28 operates to convert the analog or digital data signals of the information source 22 into a bit stream. Also, the source encoder 28 performs data compression, and outputs a sequence of binary digits to the channel encoder 30. The channel encoder 30 operates to introduce, in a controlled manner, redundancy in a binary information sequence of the bit stream, which redundancy can be used at a receiver to overcome effects of noise and interference which may be encountered in the transmission of a signal through the communication channel 24. The added redundancy serves to increase the reliability of the received data.

Examples of codes provided by channel encoders include convolutional codes (decoding using the Viterbi algorithm), Turbo codes, and interleaving for channels with burst errors. The binary sequence outputted by the channel encoder 30 is applied to the digital modulator, which serves as the interface to the communication channel 24. The primary purpose of the digital modulator 32 is to map the binary information sequence (data bits) into signal waveforms. The digital modulator 32 performs a shaping of a signal pulse in the time or frequency domain, as well as providing modulation of a carrier. In the case wherein the communication channel is characterized by radiation of the signal into the atmosphere, the output signal of the digital modulator 32 is sent to an antenna (not shown in FIG. 1). Generally speaking, the communication channel 24 is the physical medium that is used to send a signal from a transmitter, located at the transmit side 34 of the communication channel 24, to a receiver, located at the receive side 42 of the communication channel 24. In the case of wireless transmission, the communication channel 24 may be the atmosphere (free space). Such physical medium, in the case of telephone channels, may include wire lines, optical fiber cables, and wireless (microwave radio).

In FIG. 1, at the receive side 42, the demodulator 36 processes the signal received via the communication channel 24, which signal may have been corrupted, and reduces the signal into a sequence of numbers that represent estimates of the transmitted data. The sequence of numbers is passed to the channel decoder 38. The channel decoder 38 reconstructs the original information sequence from knowledge of the codes used by the channel encoder 30 and the redundancy contained in the received data. Since the demodulator 36 employs an oscillator that operates independently of a transmitter of the signal, carrier phase and frequency recovery and symbol timing recovery are needed, and circuitry providing these functions will be described below.

The encoding circuitry and the modulation circuitry provide for a variety of signaling formats, in addition to the aforementioned convolutional encoding and Turbo coding, such as CDMA, TDMA, PSK, QAM, and Reed Solomon coding. More specifically, such circuitry provides data processing or formatting for error correction and phase ambiguity resolution for multiuser (TDMA, FDMA and CDMA), spread spectrum by direct sequence (DS) or frequency hopped (FH), and modulation/signaling (PSK, QAM, MSK). The demodulation circuitry and the decoding circuitry provide the inverse of the foregoing encoding and demodulation circuits to recover the information outputted by the source 22. While the modulation circuitry and the encoding circuitry, as well as the demodulation and decoding circuitry, may comprise a set of ASICs (Application Specific Integrated Circuits) of which an individual ASIC provides a specific form of the signal formatting, a preferred embodiment of the invention is constructed preferably of programmable circuitry such as a DSP (Digital Signal Processor) or a FPGA (Field Programmable Gate Array) operative with any one of several programs which may be selected to provide the desired signal formatting. Limited programming may be provided in the ASIC if additional circuitry for the additional functions is built into the ASIC.

Digital processing is readily accomplished in the FPGA. The use of the FPGA is preferred in the construction of the invention because it enables one piece of equipment to be employed for handling any one of several possible formatting options. Alternatively, a DSP may be employed for a reduced throughput speed but increased programming capability. An ASIC may also be employed for maximum throughput speed in the situation wherein only a single format is anticipated, or also in any of a plurality of formats if the ASIC is constructed with the additional circuitry required for carrying forth the additional formats.

Figure 2:
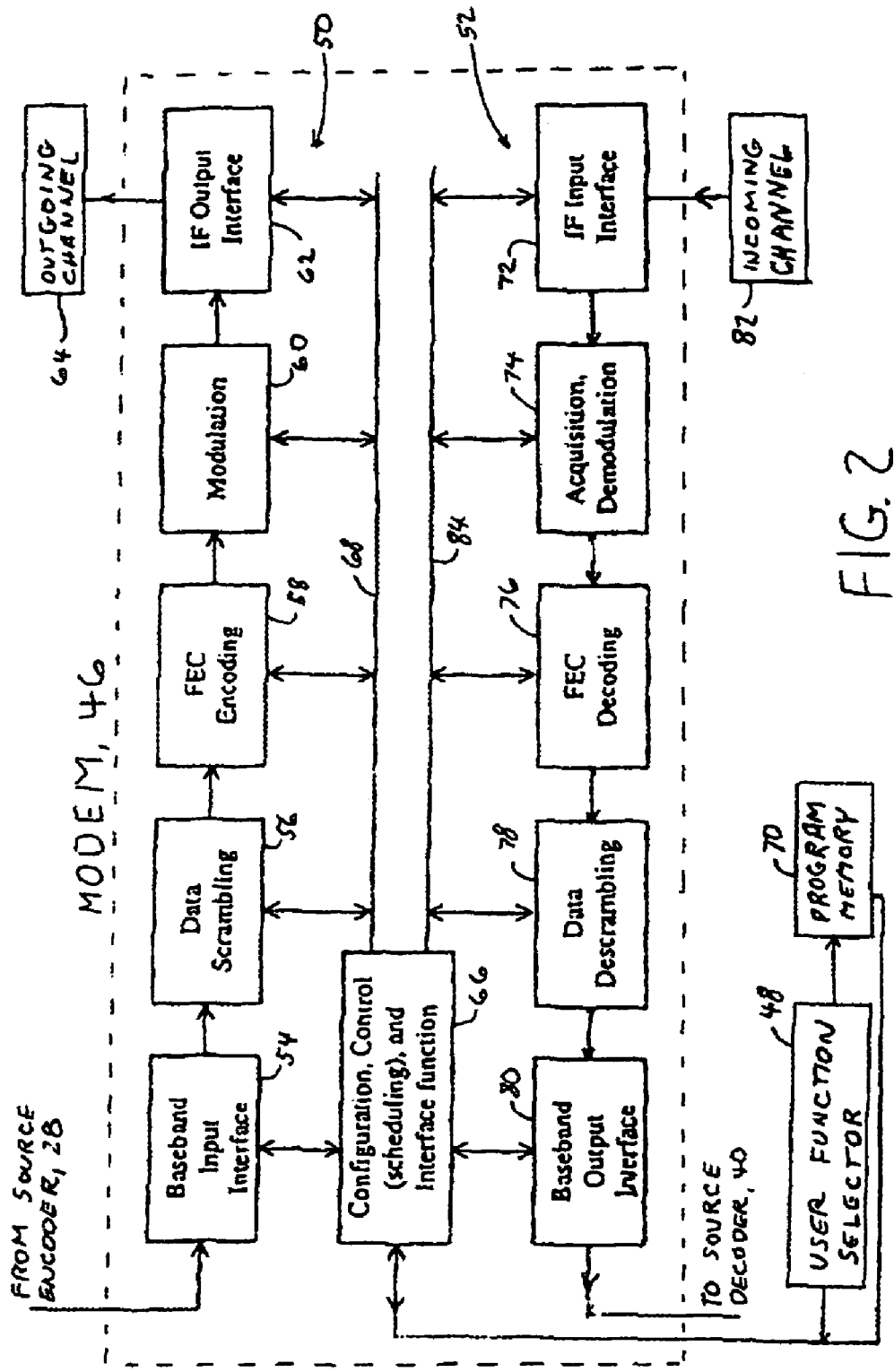
FIG. 2 is a block diagram of a modem having components which can be constructed in accordance with the block polyphase filter of the invention.

FIG. 2 shows construction of a modem 46 providing the encoding/decoding functions and the modulation/demodulation functions of the modem 44 of FIG. 1 by use of programmable circuitry. In FIG. 2, the modem 46 is responsive to a user function selector 48, wherein a user of the modem 46 inserts a requested form of coding/decoding, as well as a requested form of modulation/demodulation. The user request may be for individual ones of the codes and modulation formats mentioned above. For the implementation of programmable circuitry, the selector 48 serves the function of selecting a specific one of various programs available for operating components of the modem 46. The selection of the programming may also be accomplished automatically by the selector 48 in response to signals provided by a communication system in which the modem 46 is employed, such as in the aforementioned examples wherein it may be necessary to switch rapidly between multiple modes of communication, or in time-division multiplexing or burst-like communication in which each burst or time slot requires alteration of specific characteristics of the modem.

The modem 46 further comprises a modulation section 50 and a demodulation section 52. The modulation section 50 comprises a baseband input interface 54, a data scrambling unit 56, an FEC (forward error correction) encoder 58, a modulator 60, and an IF (intermediate frequency) output interface. The baseband input interface 54 provides for connection of signals from the source encoder 28 of FIG. 1 to the data scrambling unit 56 of FIG. 2. Output signals of the data scrambling unit 66 are fed to the FEC encoder 58 which, in turn, feeds signals to the modulator 60. The IF output interface 62 provides for connection of signals from the modulator 60 to an outgoing communication channel 64 that is external to the modem 46. The data scrambling unit 56 and the FEC encoder 58 provide functions of the channel encoder 30 (FIG. 1), as described above. Also included in the modem 46 is a controller 66 for establishing a configuration of circuitry, control of scheduling, and control of interface function for both the modulation section 50 and the demodulation section 52.

With respect to the configuration of circuitry, it is noted that various components of the modem 46, by way of example, the FEC encoder 58 and the modulator 60 may be fabricated of programmable circuitry such as an FPGA or a. DSP. The controller 66 applies the requisite program to the FPGA or DSP via bus 68 to the foregoing components of the modem 46. The specific programs and instructions administered by the controller 66 to the modem components is in accord with the user requests established by the function selector 48. Programs for configuring the FPGA and the DSP may be stored in a memory 70 at a location outside the modem 46, and may be selected by the selector 48 to be accessible to the controller 66.

The demodulation section 52 of the modem 46 comprises an IF input interface 72, a demodulator 74 that may also provide the function of signal acquisition, an FEC decoder 76, a data descrambling unit 78, and a baseband output interface 80. The IF input interface 72 provides for connection of signals from an incoming communication channel 82 to the demodulator 74. Output signals of the demodulator 74 are fed to the FEC decoder 76 which, in turn, feeds signals to the data descrambling unit 78. The baseband output interface 80 provides for connection of signals from the data descrambling unit 78 to the source decoder 40 (FIG. 1). The FEC decoder 76 and the data de-scrambling unit 78 provide functions of the channel decoder 38 (FIG. 1), as described above, these functions being the inverse of the FEC encoder 58 and the data scrambling unit 56. The demodulator 74 provides the demodulation functions described above for the demodulator 36 (FIG. 1) and also includes circuitry (to be described hereinafter) for acquisition of a received signal. With respect to the configuration of circuitry, it is noted that various components of the demodulator 74 may be fabricated of programmable circuitry such as an FPGA or a DSP. The controller 66 applies the requisite program to the FPGA or DSP via bus 84 to the components of the demodulation section 52. As in the case of the components of the modulation section 50, the specific programs and instructions administered by the controller 66 to the modem components is in accord with the user requests established by the function selector 48.

Figure 3:
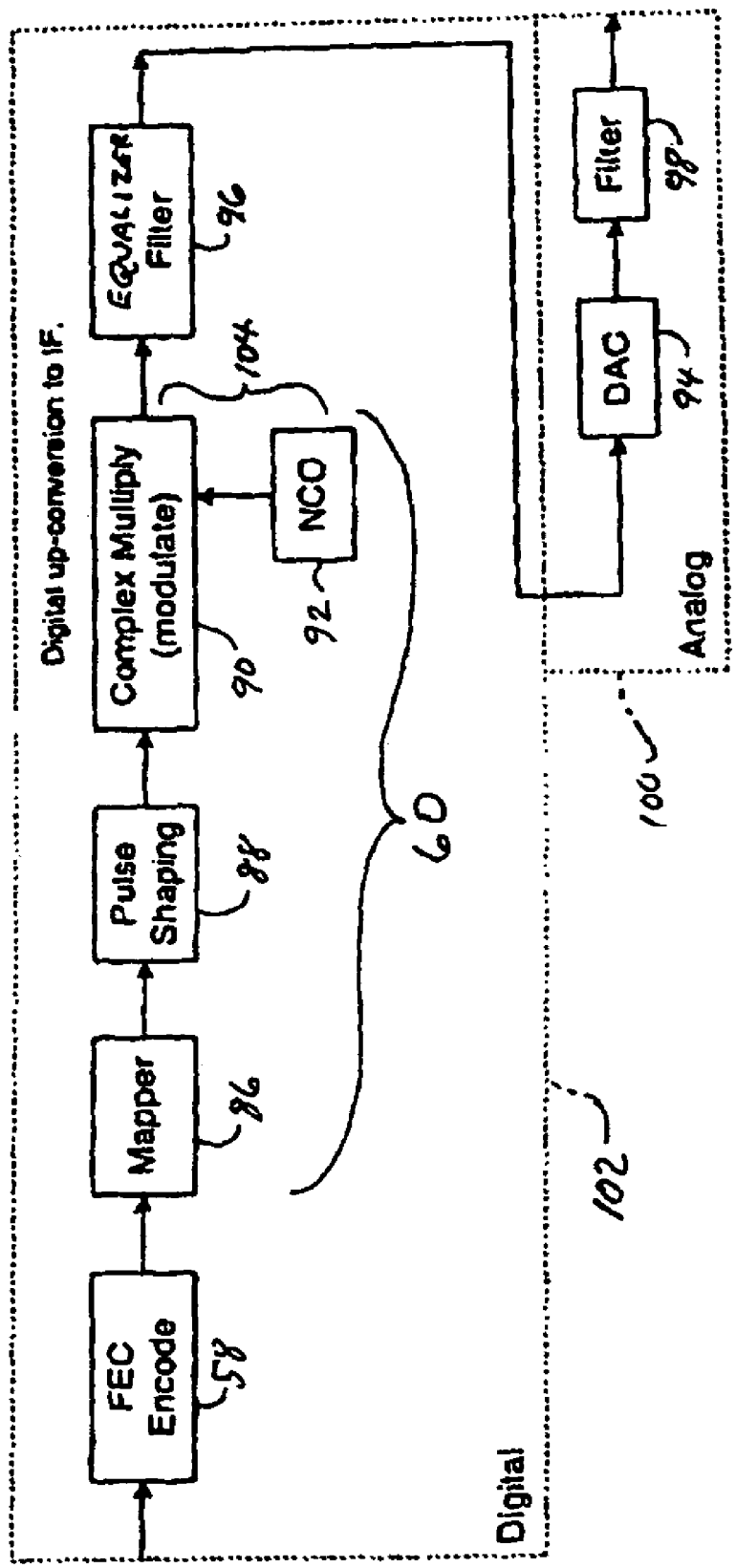
FIG. 3 is a block diagram showing components of a modulation section of the modem of FIG. 2.

FIG. 3 presents details in the implementation of the modulator 60 (FIG. 2), and indicates the use of both digital and analog forms of electrical circuitry in the construction of the modem 46 of FIG. 2. The function of the modulator 60, as shown in FIG. 3, is provided by a mapper (constellation mapper) 86, a pulse-shaping filter 88, and a complex multiplier 90 operative with in-phase and quadrature reference signals provided by a numerically controlled oscillator (NCO) 92. Also shown in FIG. 3 are the FEC encoder 58, as well as a digital-to-analog converter (DAC) 94 preceded by an equalizer filter 96 and followed by a bandpass filter 98. The equalizer filter 96 corrects for any signal distortion that may be introduced by operation of the converter 94. In the construction of the circuitry of FIG. 3, the converter 94 and the following filter 98 are constructed of analog circuitry, as indicated by a block 100, and all of the other ones of the foregoing components are constructed preferably of programmable digital circuitry (such as the above-described FPGA or DSP), as indicated by a block 102.

With respect to the FEC encoder 58, its coded output signal is applied to the mapper 86 to receive a modulation in the form of BPSK, QPSK, QAM, or FSK, by way of example. The bits of the coded signal are mapped by the mapper 86 into I and Q components. By way of example, in BPSK, one bit generates one symbol. In QPSK, two bits generate one symbol (as represented by the I and the Q components). And in 8PSK, three bits generate one symbol. The modulated signal produced by the mapper 86 is applied via the pulse-shaping filter 88 to the multiplier 90.

The multiplier 90 and the oscillator 92 function as an up-conversion unit 104. The up-conversion unit 104 is operative to translate the signal outputted via the mapper 86 and the pulse-shaping filter 88 up to a suitable value of frequency to be outputted by the modulation section 50 of the modem 46 (FIG. 2). The frequency may be an RF (radio frequency) or an IF (intermediate frequency) depending on the requirements for the modem. (In some applications, there may be requirement for an additional analog up-conversion and amplification before connection to the antenna.) In the operation of the up-conversion unit 104, the oscillator 92 outputs a signal at a predesignated frequency to the multiplier 90. The multiplier 90 multiplies the in-phase and quadrature (I and Q) components of the symbols outputted via the pulse-shaping filter 88 by the I and Q components, respectively, of the signal outputted by the oscillator 92 to produce the digital equivalent of the output signal. The digitized signal at the output of the multiplier 90 then passes through the equalizer filter 96 to be followed by conversion to an analog signal in the converter 94, and finally is filtered by the bandpass filter 98 to produce a sinusoidal waveform. The sinusoidal waveform has a modulation corresponding to the modulation imparted by the constellation mapper 86, and a carrier frequency dependent on the frequency of the oscillator 92. The output signal of the bandpass filter 98, if at IF, is fed to the IF output interface 62 of FIG. 2, and if at RF, may be fed via a power amplifier to a transmit antenna (not shown). Each of the pulse-shaping filter 88 and the DAC equalizer filter 96 can be constructed in the form of a block polyphase filter, in accordance with the invention, as will be described hereinafter.

Figure 4:
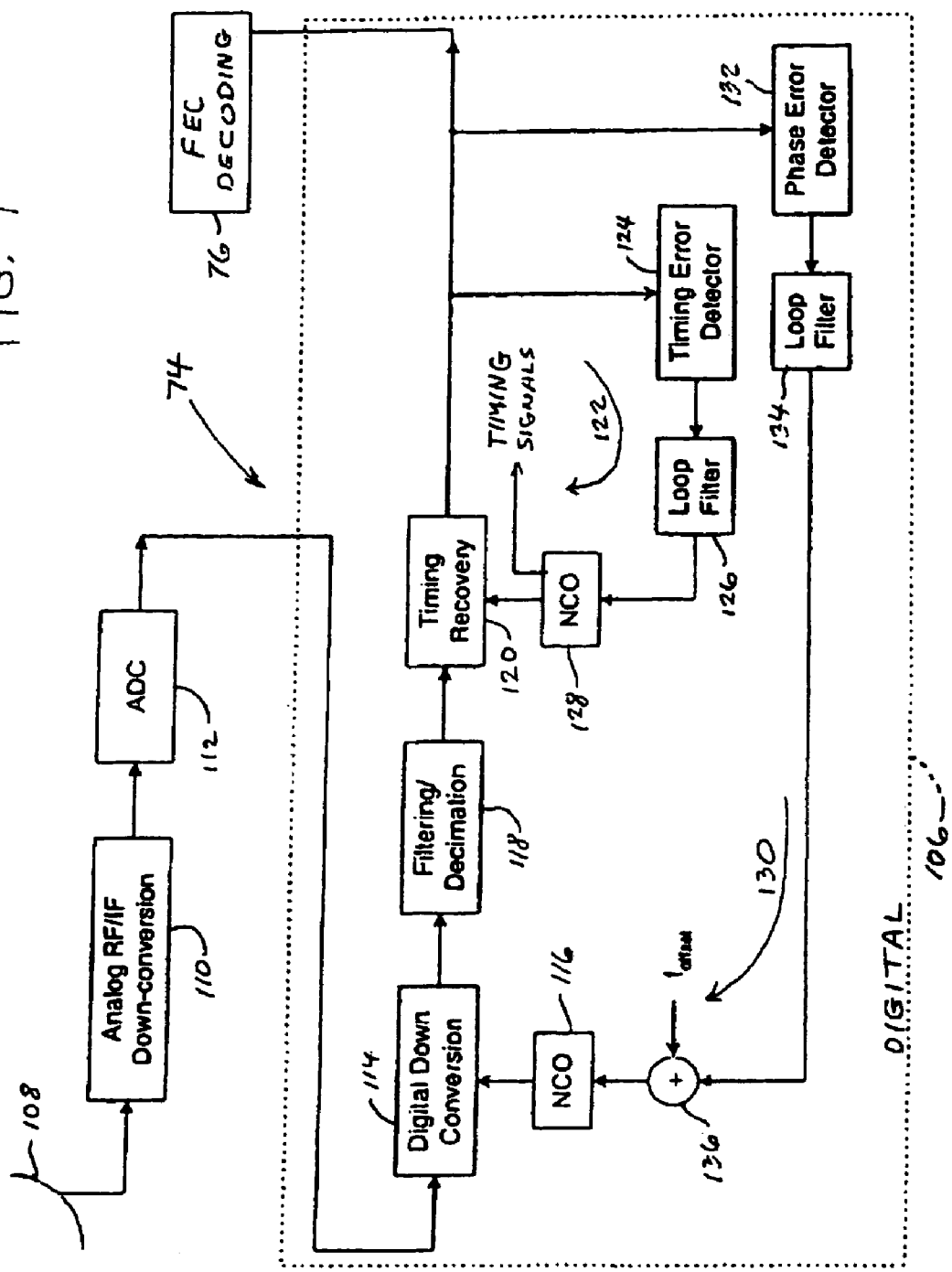
FIG. 4 is a block diagram showing components of a demodulation section of the modem of FIG. 2.

FIG. 4 shows a block diagram of the demodulation accomplished within the demodulator 74 in the demodulation section 52 of the modem 46 (FIG. 2). The demodulation process, as well as the process of acquisition of signal timing and signal phase are shown in FIG. 4 and are accomplished by digital signal processing, indicated within a dotted box 106. Preferably, the digital signal processing for both the demodulation and acquisition functions is accomplished by an FPGA programmed to perform this signal processing. In this example of the demodulator 74, timing and carrier recovery are achieved digitally within the FPGA. By way of example of signal reception, the incoming signal is presumed to be an RF signal traveling via the atmosphere, and is received via an antenna 108. The signal received by the antenna 108 is processed by analog circuitry 110 providing for a frequency down-conversion from RF to IF. The received signal at IF is then converted from analog format to digital format by an A/D converter 112. The digitized received signal outputted by the converter 112 is processed by the circuitry in block 106, and then is applied to the FEC decoder 76 (previously described with reference to FIG. 2).

In the block 106, a digital down-conversion unit 114 receives the digitized IF signal from the A/D converter 112, and translates the frequency of the digitized signal down to baseband with the aid of a reference signal, having both I and Q components, provided by a numerically controlled oscillator (NCO) 116. The baseband signal outputted by the down-conversion unit 114 is filtered by a filtering unit 118, the filtering unit 118 providing also a function of decimation and having a block polyphase construction in accordance with the invention. The filtered signal outputted by the filtering unit 118 is applied to a timing recovery unit 120 that operates in conjunction with a feedback loop 122 to acquire synchronization symbols in the received signal.

The timing recovery loop 122 comprises a timing-error detector 124, a loop filter 126, and a numerically controlled oscillator (NCO) 128 providing a feedback signal (having both I and Q components) to the timing recovery unit 120. Upon a locking of the loop 122 to the synchronization symbols, the NCO 128 provides the requisite timing signals that serve as a time base for operation of the FEC decoder 76 as well as the operation of other circuitry such as the A/D converter 112, the data descrambling unit 78 (FIG. 2) and the source decoder 40 (FIG. 1). The timing signals are indicative of frame timing.

In the operation of the timing recovery loop 122, the detector 124 outputs a time error signal via the loop filter 126 to control the NCO 128. The filter 126, which may be a low-pass filter, serves to smooth the error signal and to control the dynamic stability of the loop 122. In response to commands of the time-error signal, the NCO 128 adjusts the timing of components of the feedback signal applied to the timing recovery unit 120, thereby to align the timing signals with the synchronization symbols of the received signal.

Also included in the block 106 is a phase-recovery feedback loop 130, which comprises a phase error detector 132, a loop filter 134, a summer 136, and the aforementioned NCO 116. The loop 130 is able to acquire the phase of the received signal and to lock the output signal of the timing-recovery unit 120 to the phase of the received signal, thereby to insure accurate operation of the timing-recovery loop 122.

In the operation of the phase-recovery feedback loop 130, the detector 132 estimates the value of the phase and outputs a detected error signal to the summer 136 via the filter 134. The filter 134, which may be a low-pass filter, serves to smooth the error signal and to control the dynamic stability of the loop 130. The smoothed error signal from the filter 134 is combined with a value of reference frequency offset by the summer 136 to produce a control signal for operation of the NCO 116. Based on the control signal from the summer 136, the NCO 116 adjusts the frequency and/or phase of the reference signal applied to the down-conversion unit 114 to minimize the error signal of the phase-recovery feedback loop 130.

The filtering unit 118 may comprise a plurality of serially connected filters (as will be described subsequently with reference to FIG. 7), such as a filter for limiting the bandwidth of the signal and for providing a variable amount of decimation of the signal samples, as well as a matched filter for detecting a signal outputted by the bandwidth-limiting filter. The timing recovery unit 120 may include an adjustable delay unit (as will be described subsequently with reference to FIG. 7), wherein the delay is adjusted in accordance with timing signals fed back to the timing recovery unit 120 by the NCO 128 for attaining lock of the loop 122. The locking of the phase-recovery loop 130 provides for precision in the operation of the filters of the filtering unit 118'. The filters may be constructed in the form of a block polyphase filter, in accordance with the invention.

Figure 5:
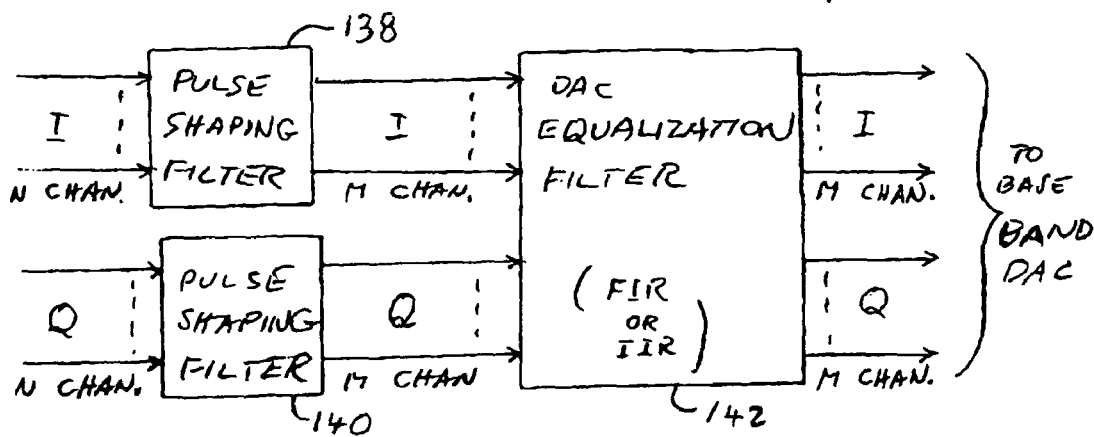
FIG. 5 is a block diagram of a pulse shaping filter coupled to an equalization filter, for use in the modulation section of the modem, wherein both filters are provided with block polyphase construction in accordance with the invention, and serves as an example of a use of the filter in a modulator for wideband applications.
Figure 6:
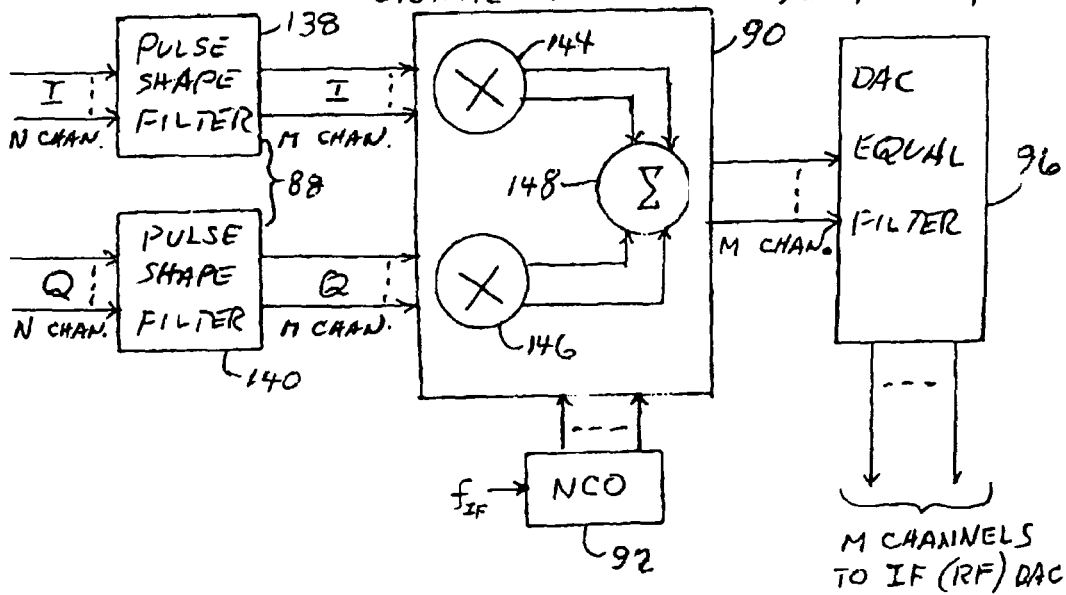
FIG. 6 is a block diagram of filter circuitry, similar to that of FIG. 5, but including a digital up-conversion between the pulse shaping filter and the equalization filter.

FIGS. 5 and 6 show examples in the use of the block polyphase filter of the invention for processing signals as may be performed, by way of example, in the digital modulation section of a modem, such as in the circuitry of block 102 of FIG. 3. FIG. 5 demonstrates the construction of the pulse shaping filter 88 and the equalization filter 96 of FIG. 3 for the situation wherein an output signal is to be at baseband, such that no digital up-conversion to IF is required and the multiplier 90 can be deleted. FIG. 6 presents the construction of the pulse shaping filter 88 and the equalization filter 96 interconnected via the multiplier 90 in FIG. 3 for the situation wherein the output signal is to be up-converted to IF. The pulse-shaping filter 88 (FIG. 3) is represented in the example of FIG. 5 by two pulse-shaping filters 138 and 140 that are employed respectively for processing the I and the Q components of an input signal. Output signals of the filters 138 and 140 are applied respectively to input terminals of an equalization filter 142. Input and output signals of each of the filters 138, 140 and 142 are digitally formatted. This also shows the possibility of using the invention for DAC equalization using a complex coefficient filter. The operation of the filter 142 may be in accordance with a finite impulse response (FIR) or an infinite impulse response (IIR).

In-phase components of the input signal to the pulse-shaping filter 138 are represented by a set of parallel channels, of which there are N channels. The plurality of input channels is provided by a demultiplexer operating on a sequence of input signal samples, as will be described hereinafter. A corresponding set of N channels are employed for representing the quadrature components of the input signal to the pulse-shaping filter 140. As will be explained in the operation of the filter of the invention, the number of output channels may be the same as, or different from the number of input channels and, accordingly, FIG. 5 shows a set of M channels for the components of the output signal of the filter 138 and a further set of M channels for the components of the output signal of the filter 140. The equalization filter 142 has circuitry for processing the in-phase signal channels, and further circuitry for processing the quadrature signal channels.

In FIG. 6, the pulse-shaping filter 88 (FIG. 3) is represented by the two pulse-shaping filters 138 and 140 that are employed respectively for processing the I and the Q components of the input signal. Output signals of the filters 138 and 140 are applied respectively to and Q input terminals of the up-conversion unit 104, and output signals of the up-conversion unit 104 are applied to the equalization filter 96. The up-conversion unit 104 comprises the multiplier 90 and the numerically controlled oscillator 92 (FIG. 3), wherein the multiplier 90 includes two multiplication sections 144 and 146 coupled respectively to output channels of the filters 138 and 140, and a summation section 148 for combining the output signals of the multiplication sections 144 and 146 to provide a real value for the output of the up-conversion unit 104. The oscillator 92 provides sine and cosine reference signals, based on an input intermediate frequency, for use by the multiplication sections 144 and 146 in raising the input baseband signals to an intermediate-frequency. The pulse-shaping filters 138 and 140 may be constructed in the same fashion as the pulse-shaping filters 138 and 140 of FIG. 6 by the block polyphase filter construction of the invention. Similarly, the equalization filter 96 of FIG. 6 may be constructed by the block polyphase filter construction of the invention.

Figure 7:
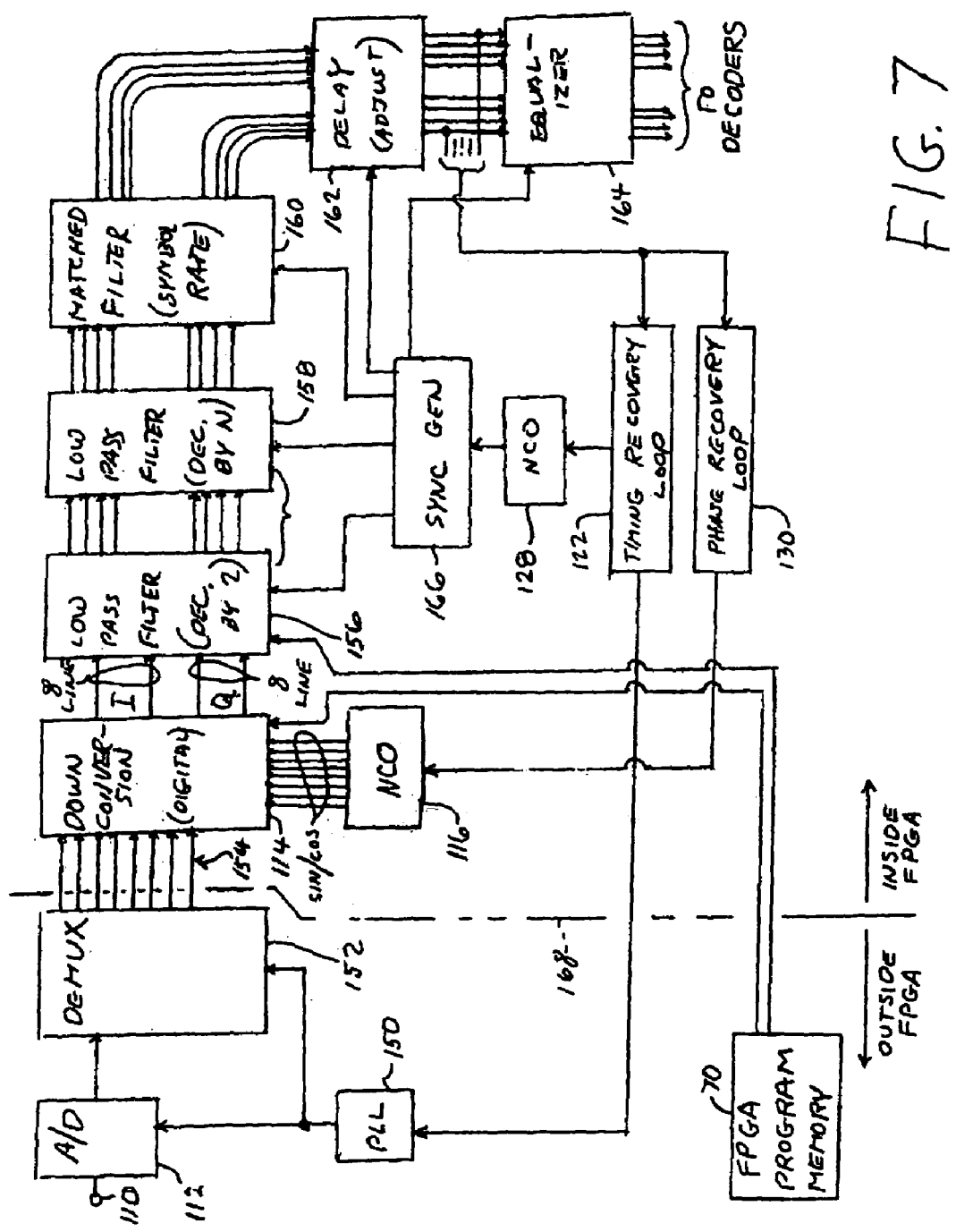
FIG. 7 is a block diagram showing detail for the filtering of the input signal to the modem, wherein various components are provided with block polyphase construction in accordance with the invention, this serving as an example of a demodulator for wideband applications.

FIG. 7 shows further details in the construction of a portion of the demodulation circuitry of FIG. 4. Thus, FIG. 7 shows the A/D converter 112 receiving an input signal from the down-conversion circuitry 110, and a reference signal from a phase-locked loop 150. The phase-locked loop 150 receives a control signal from the loop filter 126 (FIG. 4) of the timing recovery loop 122. Output signals of the A/D converter 112 are fed to the down-conversion unit 114 via a multiplexer 152 (shown in FIG. 7, but omitted in FIG. 4 to simplify the drawing). The down-conversion unit 114 receives a set of sine and cosine reference signals from the numerically-controlled oscillator 116 which, in turn, is driven by the phase-recovery loop 130 as was described above with reference to FIG. 4. The down-conversion unit 114 is constructed with a set of parallel signal processing channels.

The demultiplexer 152 is operative to convert a sequence of input signal samples, received from the A/D converter 112, into a set of parallel channels of samples of input signals wherein, by way of example, there are eight of the parallel channels collectively carrying the input signal samples, and wherein each channel operates at a reduced sample rate, in this example, of only one-eighth of the sample frequency of the signal outputted by the converter 112. The eight output channels, indicated at 154, enable the parallel channels of the down-conversion unit 114 to function at the lower clock rate, in accordance with a feature of the invention, as will be explained hereinafter.

The demultiplexer can be a high-speed digital device that takes as its input the digital signal from the A/D converter and then outputs digital signals in parallel, or on multiple channels. Alternatively, one can read a high-speed digital signal into an FPGA and then % demultiplexer the signal into multiple channels immediately. An FPGA may be able to perform this function in high speed, but the FPGA cannot perform all signal processing operations at the high speed. With the above-described serial-to-parallel conversion, the FPGA can operate at a reduced speed by using parallel signal processing.

The filtering unit 118 (described above with reference to FIG. 4) is shown in greater detail in FIG. 7 by a set of three serially connected filters, namely, a low-pass filter 156 providing decimation by a factor of 2, a low-pass filter 158 providing decimation by a factor of N, and a matched filter 160 matched to a specific characteristic of the received signal. The filters 156, 158 and 160, as well as an equalization FIR filter 164, are provided by way of example of filters constructed in accordance with the block polyphase filter realization of the invention, it being understood that other filters may be employed in the block polyphase filter realization, if desired.

An adjustable delay unit 162 of the timing recovery unit 120 (FIG. 4) is also shown in FIG. 7, following the matched filter 160. The delay provided by the delay unit 162 is adjusted by the timing recovery loop 122 to minimize the loop error, thereby to lock onto the timing signals provided by the loop 122. The adjustable delay unit 162 is followed by the equalizer filter 164, which prepares the signal for reception by the decoders, such as the FEC decoder 76 and the descrambling unit 78 of FIG. 2. The filters 156, 158 and 160, the delay unit 162, and the equalizer filter 164 are driven by clock signals of the numerically controlled oscillator 128 of the timing recovery loop 122 via a synchronization generator 166 that provides the respective timing signals.

With respect to the adjustable delay unit 162, by way of alternative embodiment in the construction of the circuitry of FIG. 7, it is noted that the delay unit 162 may be constructed as a fractional decimation/delay filter that can perform timing correction under control of a timing NCO which, in turn, is driven by the output of the timing error detector and the loop filter of the timing recovery loop 122 (shown in FIGS. 4 and 7). Such alternative embodiment can replace the need for the external PLL 150 that controls the A/D converter 112, in which case the A/D converter 112 would be free-running at a fixed-clock rate. Such fractional delay filter can also decimated by a fractional amount down to 2 samples per second prior to equalization. The equalizer filter 164 (implemented as a polyphase filter) can operate on the two samples per symbol and decimate down to generate soft-decision data, such as at one sample for symbol.

The components of FIG. 7, shown to the right of a dashed line 168, are constructed of programmable circuitry, preferably an FPGA, but other programmable circuitry such as a DSP may be used if desired. The components shown to the left of the dashed line 168, namely the A/D converter 112, the demultiplexer 152, the phase-locked loop 150 and the program memory 70, are external to the FPGA or DSP. The FPGA program memory 70 is coupled to various ones of the components of FIG. 7, such as the down conversion unit 114 and the filters 156, 158 and 169, for programmable operation of the components. Either the memory 70 located outside of the FPGA, or a large amount of memory normally provided within an FPGA, may be employed for instituting the requisite coefficients for implementing polyphase filter spectral characteristics in those components constructed as polyphase filters in accordance with the invention. In the event that a DSP or an ASIC is employed in the construction of one or more of the foregoing listed components instead of the preferred FPGA, the memory 70 would store the instructions for the operations of the DSP or ASIC. The block polyphase filter construction of the invention may be employed in the construction of one or more (preferably all) of the components, namely, the low pass filters 156 and 158, the matched filter 160, and the equalizer filter 164.

In foregoing examples of the pulse-shaping filters 138 and 140 of FIGS. 5 and 6, by employing the block polyphase filter construction of the invention in the pulse-shaping filter, the pulse-shaping filter changes the sample rate. The pulse-shaping filter is driven by a clock (not shown in FIGS. 5 and 6) and, in view of the N input channels, the sample rate at the input of the pulse-shaping filter is N times the clock rate, wherein N is the number of samples per clock period at the input of the filter. The output of the pulse-shaping filter has a sample rate which is M times the clock rate, wherein M is the number of samples per clock period at the output of the filter. With respect to modulation of the input signal, the input of the filter is at the symbol rate, and is interpolated or up-sampled by a factor of preferably 3, which factor provides for proper pulse shaping. Thus, by way of example, if the symbol rate is 200 Msym/s (million symbols per second), the sample rate (after up-sampling by a factor of 3) is 600 Ms/s (million samples per second). With use of the block polyphase (parallel) filter implementation for the pulse-shaping filter, the clock frequency of a digital signal processing device employing the pulse-shaping filter (such as the modulation section of a modem) may be 100 MHz with N=2 and M=6. With these values of N and M, the rate of the input of the pulse-shaping filter is 2 times 100 which gives 200 Msym/s, and the rate of the output is at 6 times 100 which gives 600 Ms/s.

In contrast to the foregoing description of the pulse-shaping filter, the DAC equalization filter does not change the sample rate. With reference to the foregoing example, the DAC equalization filter 96 would still the running at the clock frequency of the signal processing device (100 MHz in the foregoing example), but is effectively processing 600 Ms/s in view of the six input channels and the six output channels of the equalization filter.

Figure 8:
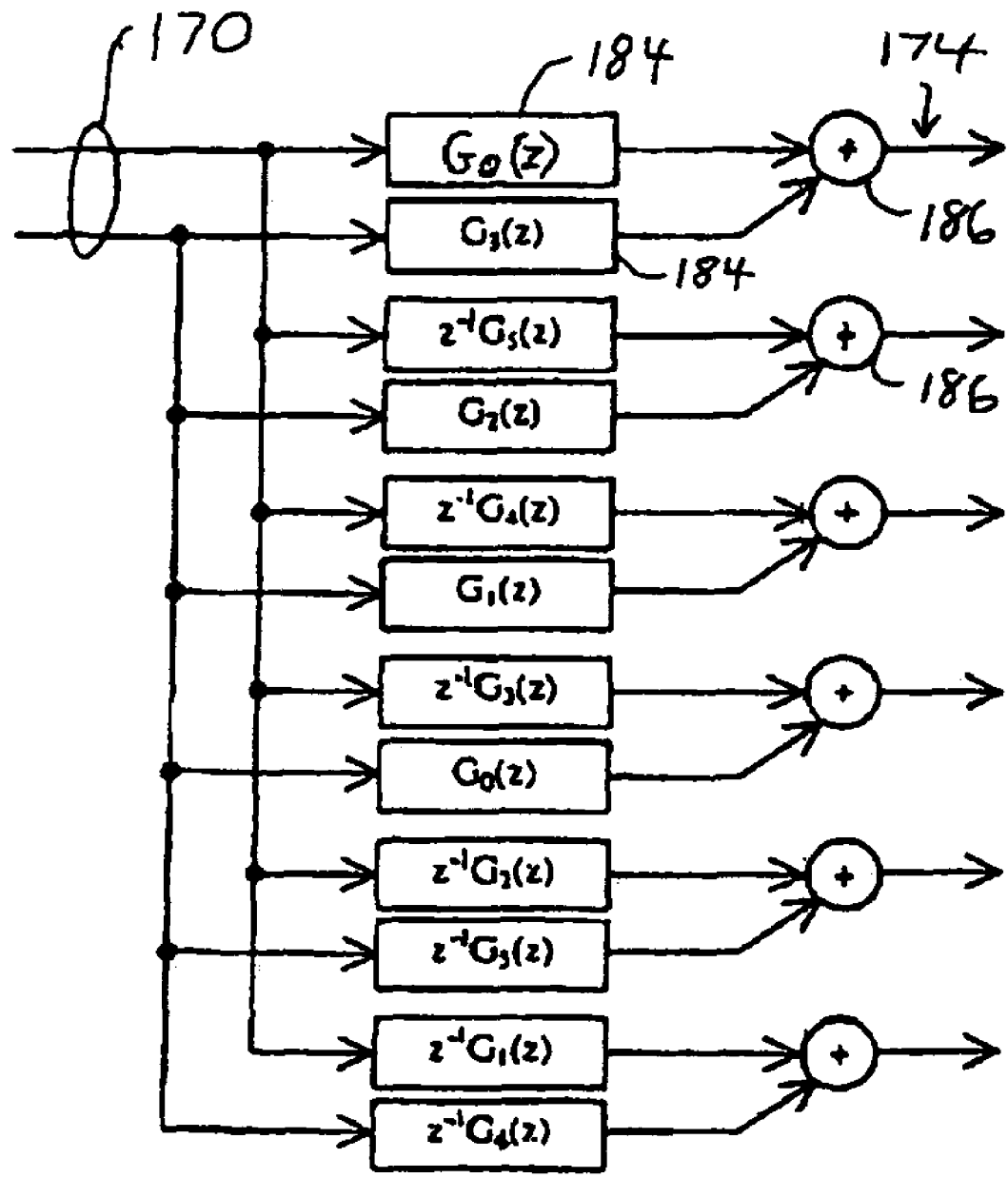
FIG. 8 presents an embodiment of a block polyphase filter in accordance with the invention providing a succession of output signals at a rate which is greater than the input-signal rate.
Figure 9:
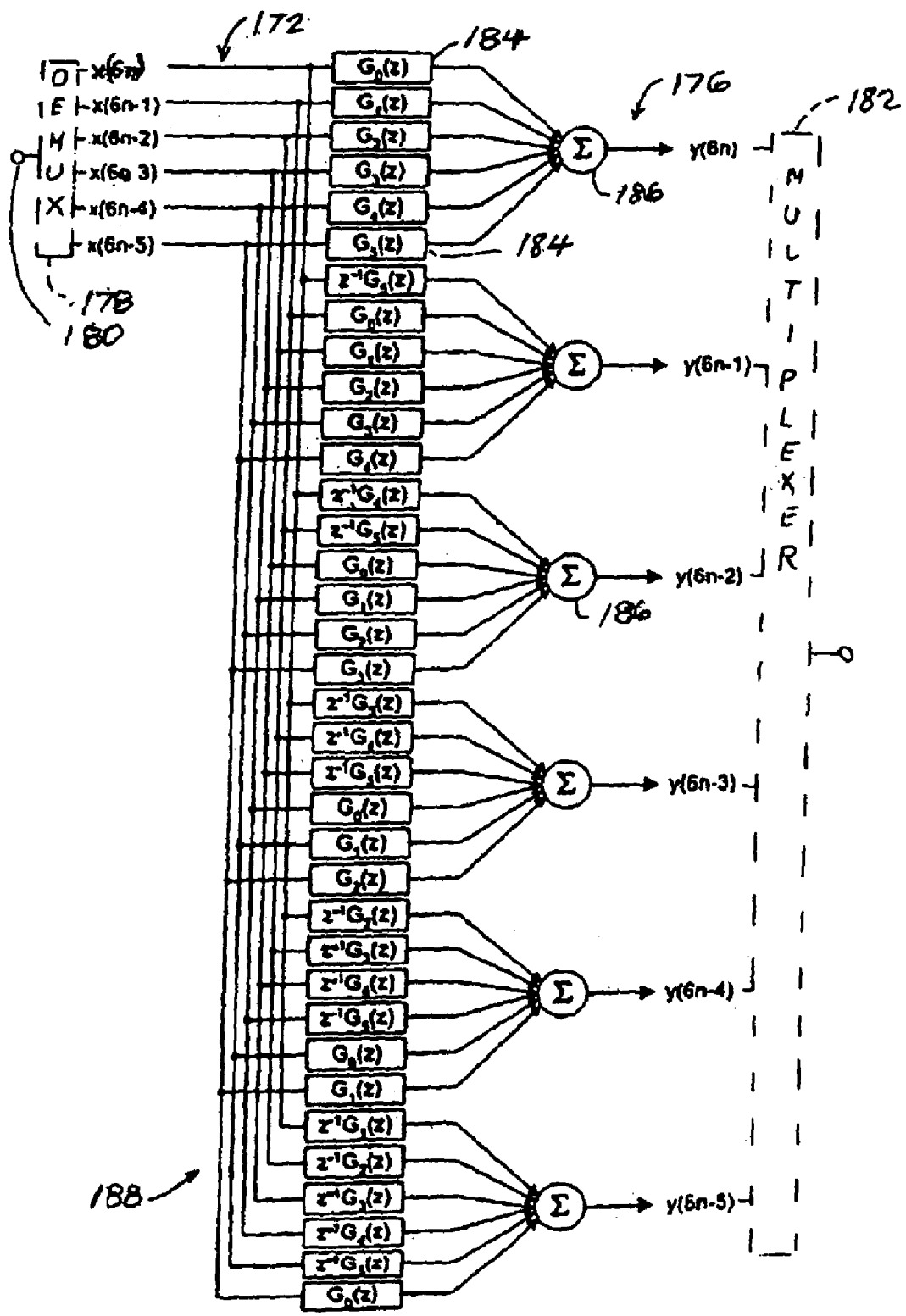
FIG. 9 presents an embodiment of a block polyphase filter of the invention having six inputs and six outputs, operating at six times the clock rate, with a succession of output signals at a rate equal to the input-signal rate.
Figure 10:
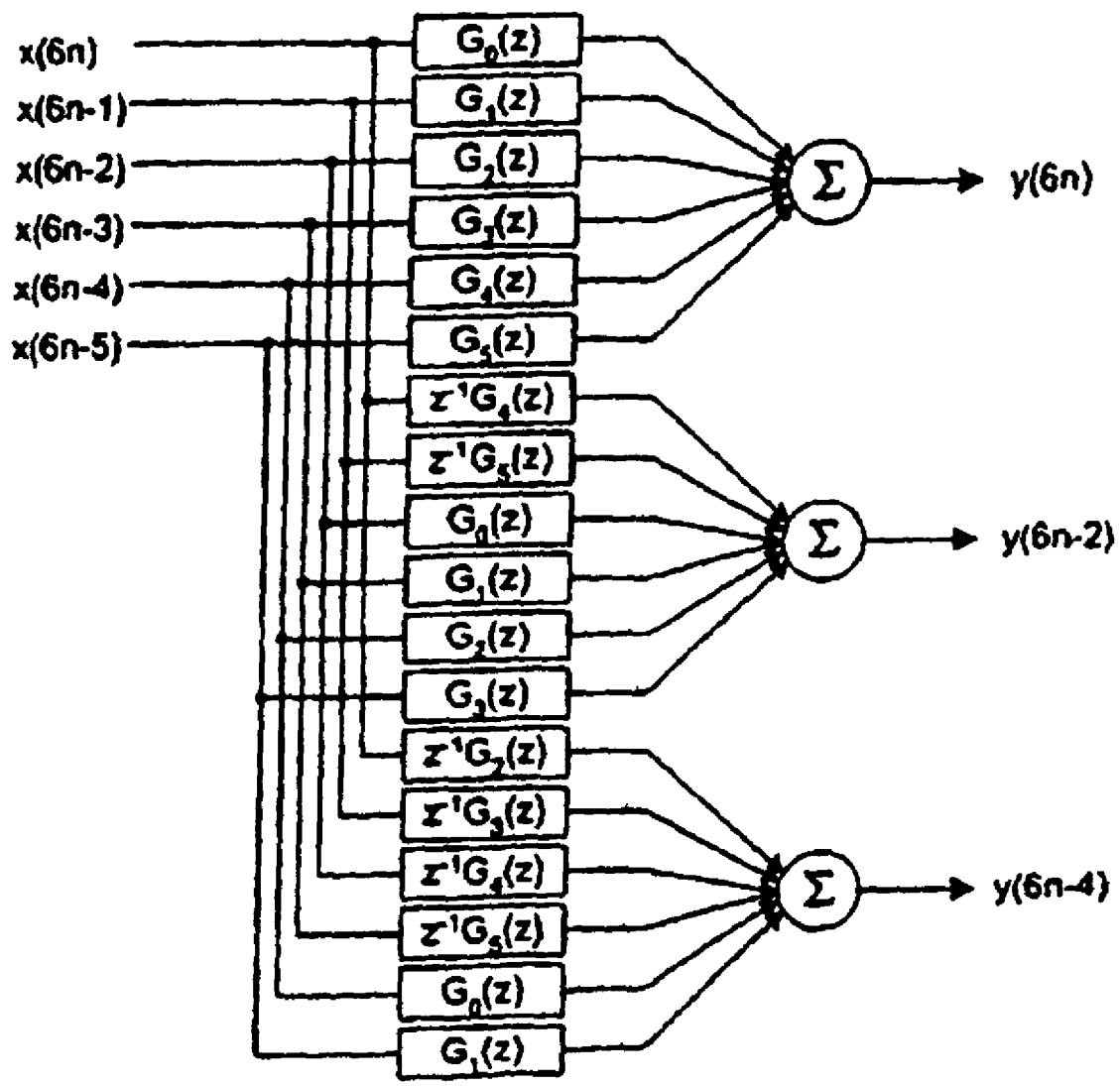
FIGS. 10-11 present embodiments of a block polyphase filters in accordance with the invention providing successions of output signals at rates which are lower than the input-signal rate.
Figure 11:
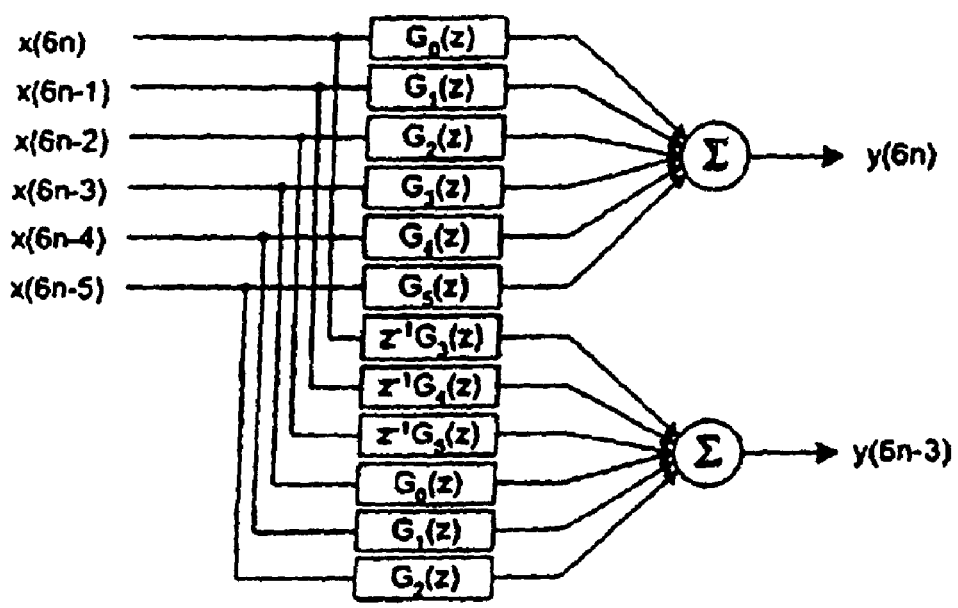

FIGS. 8-11 show, in block diagrammatic form, four manifestations of filters constructed in the block polyphase form of the invention. Each of the filters is described in terms of a filter function represented in Z-transform notation as G(z) wherein a subscript i (i is an integer), as an $G_i(z)$, identifies a polyphase component of the filter. As will be explained subsequently, the filter function is expressed as a mathematical series of which individual terms; of the series are identified with the respective ones of the filter components. The filters differ in terms of the ratio of the number of input terminals to the number of output terminals in each of the filters. Thus, FIG. 8 shows a filter having two input terminals and six output terminals, and provides a function of interpolation by a factor of three, with a resulting increase in the sample rate by a factor of three. FIG. 9 shows a filter having six input terminals and six output terminals, and provides a function of parallel processing without a change in the sample rate. FIG. 10 shows a filter having six input terminals and three output terminals, and provides a function of decimation by a factor of two, with a resulting decrease in the sample rate by a factor of two. FIG. 11 shows a filter having six input terminals and two output terminals, and provides a function of decimation by a factor of three, with a resulting decrease in the sample rate by a factor of three.

Figures 12, 22:
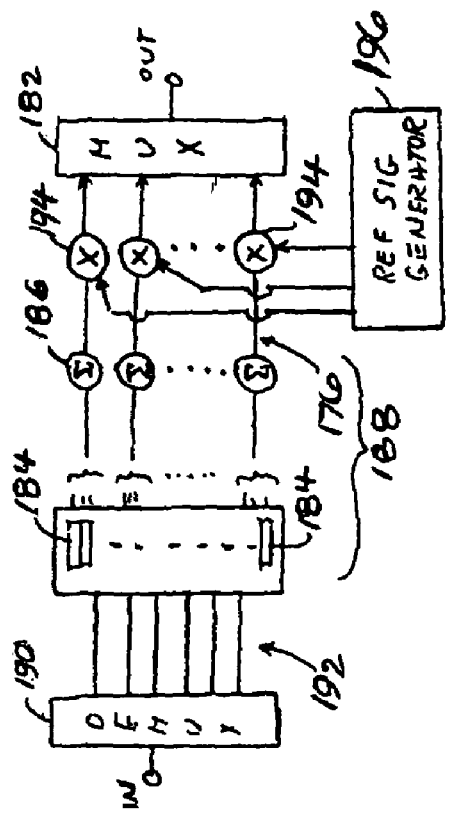
FIG. 12 shows a matrix equation explaining operation of the filters of FIG. 9-12.
FIG. 22 is a block diagram showing utilization of the filter of FIG. 10 in the construction of a digital down-conversion unit of FIGS. 4 and 7.

The operation of a filter having the form of the filter of FIG. 9, wherein the number of input terminals is equal to the number of output terminals, is expressed mathematically by a matrix equation, presented in FIG. 12, for any number of input terminals, wherein each of a plurality of outputs of the filter is obtained by a combination of all of the inputs of the filter multiplied by designated coefficients, as set forth in the matrix equation. Also included in the diagrams of FIGS. 8-11 as well as in the equation of FIG. 12 is a delay factor $z^{-1}$ that represents a delay of one period of the clock which drives the filter. FIG. 13 shows the matrix equation of FIG. 12 for the case of the six input terminals and the six output terminals of the filter of FIG. 9. FIG. 14 shows the matrix equation for the filter of FIG. 8, which is derived from the equation of FIG. 13 by deletion of the second column, the third column, the fifth column and the sixth column of the matrix of FIG. 13. FIG. 15 shows the matrix equation for the filter of FIG. 10, which matrix equation is derived from the equation of FIG. 13 by deletion of the second row, the fourth row, and the sixth row of the matrix of FIG. 13. FIG. 16 shows the matrix equation for the filter of FIG. 11, which matrix equation is derived from the equation of FIG. 13 by deletion of the second row, the third row, the fifth row and the sixth row of the matrix of FIG. 13.

As noted above, the filter of FIG. 8 is shown to have two input lines, indicated at 170, and the filter of FIG. 9 is shown to have six input lines, indicated at 172. The input lines 170 and 172 correspond to the N input channels of the filters 138 and 140 of FIG. 5. The signals for the input lines 170 and 172 may be provided by a demultiplexer, such as the demultiplexer 152 of FIG. 7 (or other multiplexer as will be described with reference to FIG. 9), or alternatively, by the output lines of a preceding filter, as in the case of the low pass filter 158 of FIG. 7 which receives its set of input signals from the corresponding set of output signals of the low pass filter 156.

The filter of FIG. 8 is shown to have six output lines, indicated at 174, and the filter of FIG. 9 is shown to have six output lines indicated at 176. The output lines 174 and 176 correspond to the M output channels of the filters 138 and 140 of FIG. 5. The signals outputted by the output lines 174 and 176 may be applied to a multiplexer or, alternatively, may be applied to the input lines of a following filter. To facilitate visualization of the operation of the filters of FIGS. 8-11, in FIG. 9 a demultiplexer 178 is shown in phantom to demonstrate how the signals for successive ones of the six input lines 172 can be obtained from a single sequence of the signals applied to the demultiplexer 178 by a single line 180. Also, a multiplexer 182 is shown in phantom to demonstrate how the signals from successive ones of the six output lines 176 can be multiplexed onto a single line for communication to a further component of a signal processing device, by way of example. The operations of the demultiplexer 178, the multiplexer 182, and individual filter blocks 184 are controlled by timing signals such as the timing signals provided by the oscillator 116 or the synchronization generator 166 of FIG. 7. Thereby, the operations of the individual filter blocks 184 of FIG. 9 can be conducted in parallel to give an effective rate of operation to the overall filter which is much greater than the rate of operation of any one of the filter blocks 184.

By way of example in the operation of the demultiplexer 178 in FIG. 9, in the first set of six signals appearing in the serially supplied signals at line 180, the first signal, x(6n−5), is applied to the filter block 184 identified as $G_5(z)$ in the first set of six blocks 184 as well as to other blocks in further ones of the sets of six blocks 184, the second signal, x(6n−4), is applied to the filter block identified as $G_4(z)$ as well as to other blocks in further ones of the sets of six blocks 184, with the process continuing in similar fashion until the sixth of the signals is applied to the block identified as $G_0(z)$ in the first set of six blocks 184. The seventh signal of the input series of signals at line 180 is applied by the demultiplexer 178 to the same blocks 184 which received the first signal, and the eighth signal of the input series is applied to the same blocks 184 which received the second signal, with the process continuing in this fashion. Thereby, each of the filter blocks 184 in any one set of the six blocks receives only specific ones of the signals of the input sequence on line 180 and, in this example wherein there are only six filter blocks 184 in any one of the six sets of the filter blocks, the signals are received at the individual filter blocks 184 at a rate which is only one-six of the rate at which signals are received via line 180 at the demultiplexer 178.

With reference to FIG. 12, the mathematical description of the operation of a block polyphase (matrix) altering operation is presented in the z-domain by a matrix equation wherein the column matrix on the left side of the equation represents a set of output signals of the filtering operation, and the column matrix on the right side of the equation represents a set of input signals to the filtering operation. In the center square matrix, $G_0(z)$, $G_1(z)$, . . . are the polyphase components of the filter G(z); $X_0$, $X_1$, . . . are the demultiplexed channels of the input signal X(z); and $Y_0$, $Y_1$, . . . , are the demultiplexed channels of the output signal Y(z). The input signal X(z) is given, in the time domain, by $x_k(n)=x(Mn-k)$ for K=0, . . . , M−1. The output signal Y(z) is given, in the time domain, by $y_k(n)=y(Mn-k)$ for K=0, . . . , M−1. The terms in successive rows of the matrix are presented as a permutation of the order of the terms appearing in the first row of the matrix. Terms of the matrix appearing below the diagonal of the matrix have the additional delay factor $z^{-1}$. For the case of a filter function represented by the six terms, $G_0(z)$ through $G_5(z)$, appearing in FIG. 9, the first set of the six blocks correspond to the terms in the first row of the matrix, with the six terms being multiplied by their corresponding input signals and being summed together at the summer 186 to give the corresponding output signal component, identified in FIG. 9 in the representation of the time domain. It is readily verified by inspection that the second set of six blocks corresponds to the terms of the second row of the matrix, with similar relationships being found between the subsequent sets of six blocks of the filter functions and the subsequent rows of the matrix as is portrayed in FIG. 13.

With reference to FIG. 8, there are two sets of six filter blocks having polyphase components of the filter G(z) and may be FIR, the polyphase components being identified as $G_0(z)$ through $G_5(z)$. The blocks 184 are arranged in groups of two blocks, each group of two blocks being coupled to a summer 186 for combining the signals outputted by the two blocks of the group. Upon inspection of the matrix equation of FIGS. 13 and 14, the arrangement of the filter components in FIG. 8 is obtained by use of the first input signal $X_0(z)$ and the fourth input signal $X_3(z)$, with the remaining four input signals being zeroed. The filter of FIG. 8 acts as a 2-to-6 pulse-shaping filter, namely that the pulse-shaping filter converts a two channel input signal set to a six channel output signal set. This provides interpolation by a factor of 3. Each of the filter blocks 184 is a polyphase component of the filter G(z). For the FIR case, the coefficient of the polyphase components (in the time domain) $G_i(n)$ are related to the filter coefficients $\{h_0, h_1, \ldots, h_L\}$ as will be described below.

The filter 188 of FIG. 9 is an example of parallel polyphase filter that may be used as a DAC equalization filter, such as the filter 142 of FIG. 5, and does not change the sample rate. In other words, the input to the filter 188 of FIG. 9 is 6 times 100 MHz (or 600 Msps) and the output is also 6 times 100 MHz (or 600 Msps). This filter may have FIR or IIR construction, and can be generalized for N-input, N-output and used generally in a high-speed filtering operation. In digital programmable demodulator circuitry, as shown in FIG. 7, this filtering approach is used to decimate by an integer factor by dropping output lines of the filter.

For examples of decimation, reference is made to the filters of FIGS. 10 and 11. The filter of FIG. 10 employs the same six inputs and as does the filter of FIG. 9, but provides three outputs to accomplish decimation by a factor of 2. The filter of FIG. 11 employs the same six inputs and as does the filter of FIG. 9, but provides two outputs to accomplish decimation by a factor of 3. As mentioned above, with reference to the use of the program memory 70 with the components of FIGS. 2 and 7, the embodiments of the filters shown in FIGS. 8-11 can be constructed in programmable format by use of an FPGA or a DSP, in which case the interconnections of the various gates and logic elements, as well as implementation of specific values of filter coefficients can be stored in the memory 70. Thereupon, the memory 70 can be addressed as may be desired for implementing various filter functions for processing signals of various modulations and codes.

A mathematical derivation of the implementation of the block polyphase filters, disclosed above, is presented now. A finite impulse response (FIR) filter is described by the difference equation (relating the input to the output)

$$y(n) = \sum_{k=0}^{K-1} h(k)x(n-k) \quad (1)$$

or, equivalently, in the z-domain by Y(z)=H(z)X(z), where H(z) is the system function, namely; the z transform of the impulse response h(n), defined as $$H(z) = \sum_{k=0}^{K-1} h(k)z^{-k} \quad (2)$$

The impulse response of the FIR system is h(n) for n=0, 1, ..., K−1, where x(n) and y(n) are respectively the discrete time input and output samples. The samples at the input and the output are separated by a sample time $T_s=1/f_s$. The delay in the filtering operation uses that same sample, $T_s$. The number representation (namely, fixed point or floating point) of the input samples, output samples, and filter coefficients depends on the application and the required system performance.

Figure 17:
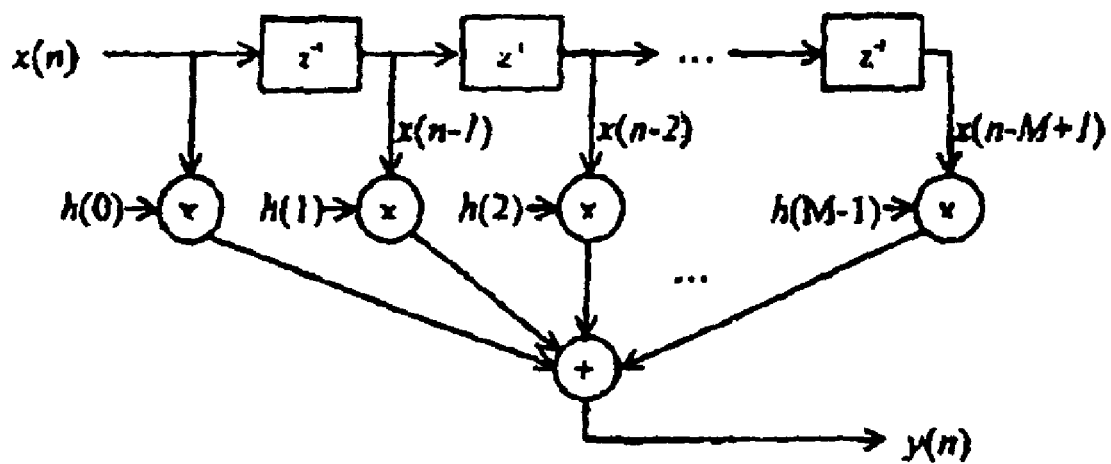

An FIR system can be implemented in either a direct form, cascade form, frequency sampling, or lattice realization. The system may be realized also by means of the discrete Fourier transform (DFT), possibly based on the fast Fourier transform (FFT) algorithms. That direct-form realization follows immediately from the non-recursive difference equation (1), and is illustrated in FIG. 17. This is used as an illustrative example. Other realizations can be used instead of using equations derived from Equation (1). FIG. 17 shows the direct-form realization of a finite-impulse response (FIR) discrete-time system or filter. The filter coefficients h(n), or equivalently the system transfer function, determine the characteristics of the system, for example, whether the system have a low-pass or high-pass characteristic.

Figure 18:

This is a K-tap FIR filter or system described by the filter coefficients h. Generally, a discrete-time system is illustrated pictorially as shown in FIG. 18. FIG. 18 presents an FIR filter (or system) represented as a block with input and output discrete-time signals. The term FIR implies that the output is generated from the input using Equation (1). In the block of FIG. 18, the legend FIR Filter could be marked as H(z), H(w) where w is radian frequency, or h(n) indicating that the system is described by that particular transfer function or impulse response function. These are all different representations of the same system, and the use of one representation over the other in the block of FIG. 18 does not imply a particular realization (or implementation) technique.

The block polyphase form of filter construction has not yet been attempted in the case of a filter having an infinite impulse response (IIR), but it is believed that the foregoing block polyphase construction applies to an IIR filter. An infinite impulse response (IIR) filter or system is described by the difference equation $$y(n) = \sum_{k=0}^{K-1} b(k)x(n-k) - \sum_{k=1}^{L} a(k)y(n-k) \quad (3)$$

where the system function namely, the z transform of the impulse response h(n), is defined as $$H(z) = \frac{\sum_{k=0}^{K-1} b(k)z^{-k}}{1 + \sum_{k=1}^{L} a(k)z^{-k}} \quad (4)$$

The system is described by the system function H(z) or by the time-domain taps, a(k) and b(k). Just as in the case of the FIR system, there may be several types of structures or realizations, including direct-form structures, cascade-form structures, lattice structures, and lattice-ladder structures. As shown in Equation (4), the filter coefficients b(k) for k=0, 1, ..., K−1, define the zeros in the system and the filter coefficients a(k) for k=0, 1, ..., L, define the poles (feedback) in the system.

The polyphase filter realization of an FIR system is obtained as follows. An FIR system can be implemented or realized using the polyphase components. That is, a filter or system can be expanded as the sum of sub-filters known as polyphase components. This expansion is useful in decimation and interpolation operations. For the case of an FIR system, Equation (2) can be expanded as follows:

$$\begin{aligned} H(z) &= \sum_{n=0}^{\infty} h(n)z^{-n} \\ &= \sum_{n=0}^{\infty} [h(Mn)z^{-Mn} + h(Mn+1)z^{-(Mn+1)} + \Lambda + \\ &\quad h(Mn+M-1)z^{-(Mn+M-1)}] \\ &= \sum_{n=0}^{\infty} h(Mn)z^{-Mn} + \sum_{n=0}^{\infty} h(Mn+1)z^{-(Mn+1)} + \Lambda + \\ &\quad \sum_{n=0}^{\infty} h(Mn+M-1)z^{-(Mn+M-1)} \\ &= z^{-0}\sum_{n=0}^{\infty} h(Mn)z^{-Mn} + z^{-1}\sum_{n=0}^{\infty} h(Mn+1)z^{-Mn} + \Lambda + \\ &\quad z^{-M+1}\sum_{n=0}^{\infty} h(Mn+M-1)z^{-Mn} \\ &= z^{-0}H_0(z^M) + z^{-1}H_1(z^M) + \Lambda + z^{-M+1}H_{M-1}(z^M), \end{aligned} \quad (5)$$

or $$H(z) = \sum_{i=0}^{M-1} z^{-i} H_i(z^M) \quad (6)$$

Where $H_i(z)$ are the polyphase components of the filter H(z). The FIR filtering operation using the expansion of Equation (6) is represented in the block diagram shown in FIGS. 19 and 20. A combining of the input-output relationship of Equation (1) in the z-domain with Equation (6) produces $$Y(z) = H(z)X(z) \quad (7)$$
$$= \sum_{i=0}^{M-1} z^{-1} H_i(z^M) X(z)$$

or $$Y(z) = \sum_{i=0}^{M-1} H_i(z^M)[z^{-i} X(z)], \quad (8)$$

in which the delays are combined with the input signal instead of the filter components as shown in FIGS. 19 and 20. The embodiments of FIGS. 19 and 20 are equivalent and their block diagrams show the polyphase realizations of FIR systems using M filter components. The filtering operation is represented as the sum of M filter components each having K/M non-zero coefficients separated by M−1 zeros. For simplicity, it may be assumed that K is an integer multiple of M (h can be padded with zeros if K is not an integer multiple of M).

Each of the blocks of FIGS. 19 and 20 represent a filter or system that is defined by the difference equation presented in Equations (1) and (2), and can be realized in any structure as discussed above. The order (or number of taps) of each of the polyphase sub-filters is K/M where K is the number of taps in the original filter h(n) and M is the expansion factor.

The filter components, $H_i(z^M)$, introduced in Equation (6) and shown in FIGS. 19 and 20, are defined by the z-transform as follows:

$$H_0(z^M) \Leftrightarrow \{h(0) 0 \Lambda 0 h(M) 0 \Lambda 0 h(2M) 0 \Lambda\}$$

$$H_1(z^M) \Leftrightarrow \{h(1) 0 \Lambda 0 h(M+1) 0 \Lambda 0 h(2M+1) 0 \Lambda\}$$

MMM $$H_{M-1}(z^M) \Leftrightarrow \{h(M-1) 0 \Lambda 0 h(2M-1) 0 \Lambda 0 h(3M-1) 0 \Lambda\} \quad (9)$$

Where h(n) are the FIR filter coefficients. $H_i(z)$ for I=0, 1, ..., M−1 are the polyphase components and are related to the time domain filter coefficients h(n) for n=0, 1, ..., M−1 by $h_i(n)=h(Mn+i)$ or, explicitly stated, by $$H_0(z) \Leftrightarrow h_0 = \{h(0) h(M) h(2M) \Lambda\}$$

$$H_1(z) \Leftrightarrow h_1 = \{h(1) h(M+1)(2M+1) \Lambda\}$$

MMM $$H_{M-1}(z) \Leftrightarrow h_{M-1} = \{h(M-1) h(2M-1) h(3M-1) \Lambda\} \quad (10)$$

It is noted that the filter components shown in Equation (9) are an interpolated version (by interpolation factor of M) of the polyphase filter components presented, in Equation (10). The non-zero coefficients in Equation (9) are separated by M−1 zeros, which are identified in the z-domain by the expression $z^M$ instead of z.

In the process of decimation, in a sequence of samples outputted by a filter, some of the samples may be deleted (down-sampling). There is no loss of information in the decimation process if the signal is band-limited, and the resulting sample rate, after the decimation, satisfies the Shannon sampling theorem, wherein the sampling rate must be higher than twice the maximum frequency content of the signal. These operations are generally illustrated in a diagram as shown in FIG. 21, wherein the filtering (independent of the method of implementation of the decimation) is running at the sample rate with sample time of $T_s=1/f_s$ although samples are discarded by the down-sampling operation and are not needed. The operation denoted by the down arrow and letter D is the operation of down-sampling or reducing the sampling rate by a factor of D. For example, if the sample time for x(n) and y(n) is $T_s=1/f_s$, then the sample time for z(n) is $DxT_s=1/(f_s/D)$. This operation is a taking of one sample out of D samples as defined by the following equation:

$$y'(m)=y(Dm)$$

As an example, let y(n)={0.1, 0.2, 0.3, 0.4, 0.5, 0.6} for n=0, 1, 2, 3, 4, 5, and let D=2, then y'(m)={0.1, 0.3, 0.5} for m=0, 1, 2, since y'(m)=y(2m) for all m=−0, 1, 2, (or y'(0)=y(0), y'(1)=y(2), and y'(2)=y(4)). These samples and their indices do not in the show the sample rate (namely, time step between samples), but it is understood that if the samples in y are separated by $T_s$, the samples in y' are separated by $2T_s$. The filtering process (independently of the filter realization) is processing input samples at the high sample rate of $1/T_s$ although samples are discarded by the down-sampling operation that immediately follows the filtering. Such wasteful processing is recovered by use of the polyphase filter realization.

An equivalent approach to the above filtering and down-sampling operations, as shown in FIG. 21, is the polyphase implementation (or structure) described above. This implementation is equivalent and has the advantage of avoiding filtering at the high rate of $1/T_s$. With the polyphase structure, samples are discarded at the input of the filter instead of at the output, thereby making the operation more efficient.

Upon a review of the arrangements of the filter functions of the signal-processing elements in the various filter blocks 184 in the embodiments of FIGS. 8-11, and upon comparing the arrangements with the matrix formulation of FIG. 13, it may be possible to generalize the relationships among the various embodiments as follows. First, it is noted that in each of the embodiments of FIGS. 8-11, one can identify groups of six filter functions corresponding to the six rows of the matrix of FIG. 13. Six of these groups are found in the embodiment of FIG. 9 (corresponding to the six filter sections associated with each of the summers 186) while only two of these groups are found in the embodiments of FIGS. 8 and 11 and three of these groups are found in the embodiment of FIG. 10. For the general case of K different ones of the signal-processing elements, there is a mathematical relationship expressed by the matrix formulation (FIG. 12) among the input succession of signal samples and the output succession of signal samples based on the ordering of the K signal processing elements in the matrix of FIG. 13. The mathematical relationship provides for an ordering of the signal-processing elements among the successive groups of K filter channels (which may extend among a plurality of the filter sections) be a permutation of the K signal-processing elements in a row of the matrix.

FIG. 22 demonstrates how the filter 188 of FIG. 10, which employs the polyphase construction of the invention, can be employed to construct a digital down-conversion unit such as the down-conversion unit 114 of FIGS. 4 and 7. An input signal is demultiplexed at the demultiplexer 190 to provide a set of input signal-carrying lines 192 of reduced sample rate. The signal samples are then processed by the filter blocks 184 and are outputted via the summers 186 at the reduced rate to provide a set of demultiplexed output samples of the filter 188. The output samples, on the respective output lines, appear at a sufficiently low sample rate to facilitate further digital signal processing operations to accomplish the down-conversion, as from IF to baseband, by way of example. The down-conversion operation is represented by a set of multipliers 194 operating with reference signals from a generator 196 to convert the outputted sequences of signal samples on respective ones of the output lines to sequences of signal samples at baseband. The resulting down-converted signals are then multiplexed at the multiplexer 182 to provide an output sequence of signals on a single output line or, if desired, the set of output lines from the multipliers 194 may be applied directly to a further polyphase filter.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A filter operative with an input succession of signal samples for producing an output succession of filtered signal samples, comprising:

a set of M filter sections wherein each of the filter sections has N parallel filter channels and a summing element connected to output terminals of the N parallel filter channels;

a first circuit for distributing N input signal samples, from the input succession of signal samples, respectively to the filter channels in each of the filter sections;

wherein each of the filter sections comprises N signal-processing elements located in respective ones of the filter channels, each of the signal-processing elements being operative upon an input signal sample to provide a processed signal sample, the processed signal samples of the respective channels of the filter section being summed by the summing element to provide one of said filtered signal samples in the output succession of the filtered signal samples;

a second circuit connected to output terminals of the summing elements in respective ones of said filter sections, the second circuit serving for multiplexing the filtered signal samples to provide said output succession of the filtered signal samples; and wherein there is a number k of said signal-processing elements, there is a mathematical relationship expressed by a matrix formulation among the input succession of signal samples and the output succession of signal samples based on an ordering of the K signal-processing elements in a matrix of the matrix formulation, and an ordering of the signal-processing elements among successive groups of K filter channels of a plurality of said filter sections is a permutation of said K signal-processing elements in a row of said matrix; and wherein M is greater than N with M being equal to a preselected value to provide an interpolation function, or M is less than N with N being equal to the preselected value to provide decimation.

2. A filter according to claim 1 wherein an ordering of the signal-processing elements among the channels of a first of said filter sections is permuted to provide an ordering of the signal processing elements among the channels of a second of said filter sections.

3. A filter according to claim 1 wherein there are N different orderings of the signal-processing elements among the N channels of each of the filter sections, the difference in the ordering being obtained by a permutation of the N signal-processing elements in each filter section.

4. A filter according to claim 1 wherein M is greater than N to provide an interpolation function.

5. A filter according to claim 1 wherein M is less than N to provide decimation.

6. A filter according to claim 1 wherein each signal-processing element provides a filter function, and wherein the filter is programmable by construction as an FPGA, a DSP, or an ASIC to provide any one of a plurality of filter functions in accordance with instructions stored in a program memory.

7. A filter according to claim 6 wherein the filter functions of the respective filter channels cooperate to provide a finite impulse response (FIR) for the filter.

8. A filter according to claim 6 wherein the filter functions of the respective filter channels cooperate to provide an infinite impulse response (IIR) for the filter.

9. A filter according to claim 6 wherein, in said matrix, signal-processing elements lying below a diagonal of the matrix include a delay factor.

10. A filter according to claim 9 wherein the delay introduced by said delay factor is equal to the period of a clock interval of a clock driving each of said signal-processing elements.

11. A filter according to claim 10 wherein a pulse repetition frequency of signal pulses applied to one of said filter channels is lower than a pulse repetition frequency of signal pulses of said input succession of signal samples to enable operation of said signal-processing elements at a reduced clock speed.

12. A filter according to claim 1 wherein said first circuit comprises a demultiplexer for extracting a sequence of N input signal samples from the input succession of signal samples, and said second circuit comprises a multiplexer.

13. A method of operating a filter with an input succession of signal samples for producing an output succession of filtered signal samples, comprising the steps of:

providing a set of M filter sections wherein each of the filter sections has N parallel filter channels and a summing element connected to output terminals of the N parallel filter channels;

extracting a sequence of N input signal samples from the input succession of signal samples, and applying the N input signal samples respectively to the filter channels in each of the filter sections;

arranging, in each of the filter sections, N signal-processing elements in respective ones of the filter channels, wherein each of the signal-processing elements is operative upon an input signal sample to provide a processed signal sample;

summing, in each of the filter sections, the processed signal samples of the respective channels of the filter section by the summing element to provide one of said filtered signal samples in the output succession of the filtered signal samples;

outputting filtered signal samples of the respective summing elements to provide said output succession of the filtered signal samples; and wherein there is a number K of said signal-processing elements, there is a mathematical relationship expressed by a matrix formulation among the input succession of signal samples and the output succession of signal samples based on an ordering of the K signal-processing elements in a matrix of the matrix formulation, and said arranging step includes an ordering of the signal-processing elements among successive groups of K filter channels of a plurality of said filter sections as a permutation of said K signal-processing elements in a row of said matrix; and wherein M is greater than N with M being equal to a preselected value to provide an interpolation function, or M is less than N with N being equal to the preselected value to provide decimation.

14. A method according to claim 13 wherein said extracting step includes a step of demultiplexing said input succession of signal samples.

15. A method according to claim 13 wherein said outputting step includes a step of multiplexing signals outputted by respective ones of the summing elements.

16. A method according to claim 13 wherein the ordering of the signal-processing elements among the channels of a first of said filter sections is permuted to provide an ordering of the signal processing elements among the channels of a second of said filter sections.

17. A method according to claim 13 wherein there are N different orderings of the signal-processing elements among the N channels of each of the filter sections, the difference in the ordering being obtained by a permutation of the N signal-processing elements in each filter section.

18. A method according to claim 13 wherein M is greater than N to provide an interpolation function.

19. A method according to claim 13 wherein M is less than N to provide decimation.

20. A method according to claim 13 wherein each signal-processing element provides a filter function, wherein the filter is programmable by construction as an FPGA, a DSP, or an ASIC to provide any one of a plurality of filter functions in accordance with instructions stored in a program memory, and wherein there is a step of programming the filter to provide a specific one of said plurality of filter functions in accordance with instructions stored in the program memory.

21. A method according to claim 20 wherein the filter functions of the respective filter channels cooperate to provide a finite impulse response (FIR) for the filter.

22. A method according to claim 20 wherein the filter functions of the respective filter channels cooperate to provide an infinite impulse response (IIR) for the filter.

23. A method according to claim 20 wherein, in said matrix, signal-processing elements lying below a diagonal of the matrix include a delay factor.

24. A method according to claim 23 wherein the delay introduced by said delay factor is equal to the period of a clock interval of a clock driving each of said signal-processing elements.

25. A method according to claim 24 wherein a pulse repetition frequency of signal pulses applied to one of said filter channels is lower than a pulse repetition frequency of signal pulses of said input succession of signal samples to enable operation of said signal-processing elements at a reduced clock speed.

* * * * *